United States Patent
Komatsu et al.

[11] Patent Number: 5,838,593
[45] Date of Patent: Nov. 17, 1998

[54] SIMULATION APPARATUS

[75] Inventors: Hiroaki Komatsu; Minoru Saitoh, both of Kawasaki; Toshihide Sasaki; Hiroshi Tsukamoto, both of Kitsuregawa-machi, all of Japan

[73] Assignees: Fujitsu Limited; Fujitsu Automation Limited, both of Kawasaki, Japan

[21] Appl. No.: 539,775

[22] Filed: Oct. 5, 1995

[30] Foreign Application Priority Data

Mar. 20, 1995 [JP] Japan ................................. 7-060910

[51] Int. Cl.⁶ ........................................................ G06F 3/00
[52] U.S. Cl. ............................................ 364/578; 395/500
[58] Field of Search ........................... 364/578, 488–491; 371/23; 395/560

[56] References Cited

U.S. PATENT DOCUMENTS

| | | | |
|---|---|---|---|
| 4,306,286 | 12/1981 | Cocke et al. | 364/200 |
| 4,635,218 | 1/1987 | Widdoes, Jr. | 364/578 |
| 4,744,084 | 5/1988 | Beck | 371/23 |
| 4,891,773 | 1/1990 | Ooe et al. | 364/578 |
| 4,901,259 | 2/1990 | Watkins | 364/578 |
| 5,146,460 | 9/1992 | Ackerman et al. | 371/23 |
| 5,369,593 | 11/1994 | Papamavcos et al. | 364/488 |
| 5,442,772 | 8/1995 | Childs et al. | 395/500 |
| 5,546,562 | 8/1996 | Patel | 395/500 |
| 5,596,587 | 1/1997 | Douglas et al. | 371/27 |

FOREIGN PATENT DOCUMENTS

| | | | |
|---|---|---|---|
| 5165914 | 7/1993 | Japan | 364/578 |
| 2138605 | 10/1984 | United Kingdom | 364/578 |
| 2164768 | 3/1986 | United Kingdom | 364/578 |
| 2164768 | 8/1986 | United Kingdom | 364/578 |

OTHER PUBLICATIONS

S. Mochizuki, *Parallel Logic Simulator*, Japanese Patent Laid–Open (Kokai) No. HEI 5–174097, Laid–Open Date: Jul. 13, 1993. Abstract Only.

S. Mochizuki, *Parallel Logic Simulator*, Japanese Patent Laid–Open (Kokai) No. HEI 5–165914, Laid–Open Date: Jul. 2, 1993.

S. Mochizuki, *Parallel Logic Simulator*, Japanese Patent Laid–Open (Kokai) No. HEI 5–165915, Laid–Open Date: Jul. 2, 1993.

H. Ishikura, *Parallel Logic Simulation Method*, Japanese Patent Laid–Open (Kokai) No. HEI 5–165916, Laid–Open Date: Jul. 2, 1993.

Microsoft Press Computer Dictionary, Second Edition, 1994 at pp. 361,362.

*Primary Examiner*—Kevin J. Teska
*Assistant Examiner*—A. S. Roberts
*Attorney, Agent, or Firm*—Staas & Halsey

[57] ABSTRACT

The present invention is a simulation apparatus which can shorten the transmission and reception time of events, and unify simulation models to make it possible to use the same language expression as that for an ordinary model to express a real chip. The simulation apparatus comprises a real chip simulation section for carrying out simulation for a portion having an unknown internal logic by using a real chip, a logic simulation hardware section for carrying out simulation for a portion whose internal logic is described, and a high speed dedicated network for transferring event data between the real chip simulation section and the logic simulation hardware section. The simulation apparatus can be applied to hardware accelerators used in logic timing simulation in the field of CAE.

25 Claims, 21 Drawing Sheets

F I G. 13
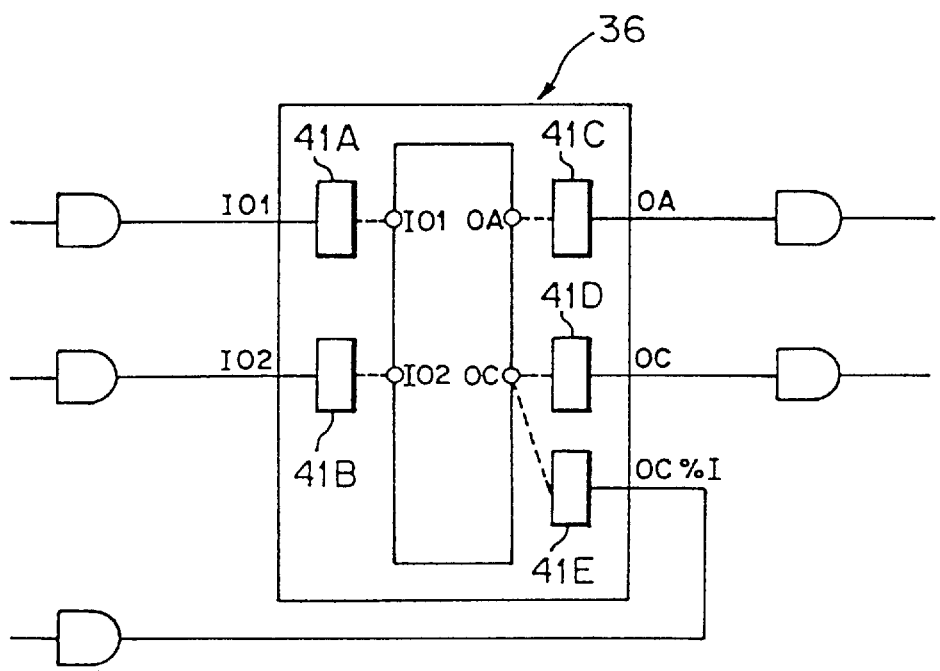

F I G. 15
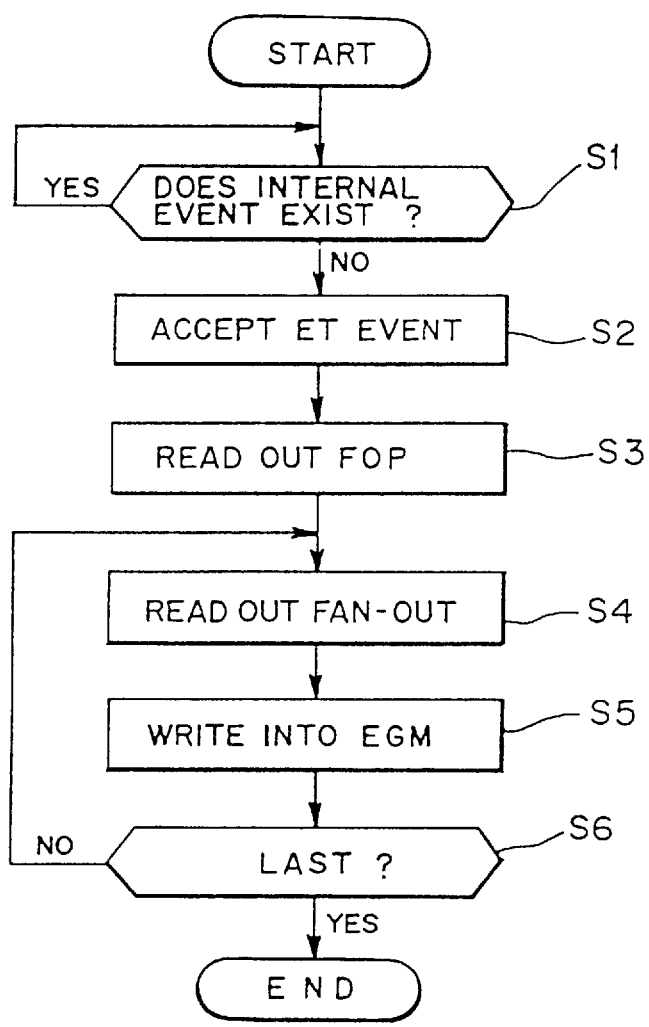

SIMULATION APPARATUS

BACKGROUND OF THE INVENTION

1. Field of the Invention

The present invention relates to a simulation apparatus for simulating a logic circuit including a portion having an unknown internal logic, in which simulation is performed using a real chip (real part) which forms the portion having an unknown internal logic instead of creating a simulation model of the portion having an unknown internal logic. In particular, the present invention relates to a system for simulating a real chip on a hardware accelerator (hardware section dedicated for logical simulation) which is used in logic timing simulation in the field of CAE (Computer Aided Engineering).

2. Description of the Related Art

The necessity and importance of simulation is recognized in the field of CAE, and it is general practice to perform simulation in a design step. It is important to perform logic simulation for inspection at a system level and/or a board level. When a circuit including a part having an unknown internal logic, such as an MPU on the market, is simulated, so-called "real chip simulation" is employed in which a real chip is used instead of creating a simulation model of the part having an unknown logic. This method is effective in simulation performed in a recent CAE system, especially in simulation on a work station.

One method for modeling a part having an unknown internal logic is to express the part using an operation describing language. However, since a description made by the language is complex and huge, the method has the problems that a considerably long time is required to create a model, that complete modeling is impossible, and that it is difficult to verify the created model. In contrast, real chip simulation has the merits that modeling of a part is unnecessary, and that a complete model can be obtained.

A conventional simulation apparatus which can carry out real chip simulation requires a dedicated real chip drive apparatus (hardware apparatus) on which a real chip is mounted to be driven, and a platform (e.g., a work station) for performing logic simulation, as well as a LAN for connecting the hardware apparatus and the platform.

In such a simulation apparatus, if it becomes necessary to drive the real chip when the platform performs logic simulation for an ordinary gate model (simulation mode of a gate having a known internal logic), the simulation program on the platform stops the logic simulation for the ordinary gate model, and transmits to the real chip drive apparatus an event which indicates an input change for the real chip.

Upon the reception of the event, the real chip drive apparatus initializes the corresponding real chip, holds events which have been received up to the present, as history data, and supplies the history data to the real chip. After supplying the last event, the drive apparatus samples an output value which reflects the event. The drive apparatus converts the sampled values into an event form which can be input to the simulation program on the platform, and transmits the converted value to the platform as an event from the real chip.

When the simulation program on the platform receives the event from the real chip drive apparatus, the program ends the simulation for the real chip and resumes the logic simulation for the ordinary model.

The conventional simulation apparatus carries out the above-described series of operations to perform real chip simulation.

However, when the simulation is performed by the conventional simulation apparatus, the real chip and a primitive, which is a minimum unit of processing performed by the simulation program on the platform, are treated alike. Hence, the simulation program on the platform cannot perform processing for the next primitive until the evaluation of the real chip has been completed (i.e. during the period of time between the transmission of an event to the real chip and the reception of an output value corresponding to the event from the real chip).

When simulation for the real chip and simulation for other portions are simultaneously performed in parallel, it becomes impossible to process a new event for an input terminal of the real chip if such an event is generated during the simulation of the real chip.

In other words, while the real chip is driven, the simulation for the gate model cannot be performed at all, or can be performed within a limited range only. Accordingly, efficient simulation cannot be carried out.

In addition, events must be transmitted and received between the simulation program and the real chip drive apparatus (hardware apparatus) using the LAN. Hence, as the number of events increases, the time required for communication which does not directly relate to the simulation increases, and such communication time cannot be shortened. Accordingly, the time required for the simulation increases, thereby preventing the realization of high speed simulation.

Also, a user of the simulation program must indicate clearly that the real chip is used as a simulation model. This requires special attention by the user, and therefore it is inconvenient for the user.

SUMMARY OF THE INVENTION

In view of the foregoing problems, an object of the present invention is to provide a simulation apparatus which can shorten the transmission and reception time of events, and unify simulation models to make it possible to use the same language expression as that for an ordinary model so as to express a real chip, thereby realizing high speed simulation using a simulation model including a real chip.

In order to attain the object described above, the present invention provides an improved simulation apparatus for simulating a logic circuit which includes a portion having an unknown internal logic. The simulation apparatus comprises a real chip simulation section on which a real chip which forms the portion having an unknown internal logic is mounted and which simulates the portion having an unknown internal logic by driving the real chip, a hardware section dedicated for logic simulation (hereinafter referred to as "logic simulation hardware section") which simulates a portion of the logic circuit, the internal logic of the portion being described using a language, and a high speed dedicated network for connecting the real chip simulation section and the logic simulation hardware section so as to transfer event data between the real chip simulation section and the logic simulation hardware section.

As described above, in the present invention, real chip simulation can be performed without hindering the functions of a hardware accelerator (special hardware dedicated for logic simulation) which performs high speed simulation. In addition, since the portion for driving the real chip is directly built into the portion where operation for the simulation is performed, the time required for the transmission and reception of events can be shortened, so that the speed of the simulation can be increased.

BRIEF DESCRIPTION OF THE DRAWINGS

FIG. 13 is a block diagram showing the result which is obtained by expressing the real chip shown in FIG. 12 by using the primitive of the present embodiment;

FIG. 15–FIG. 18 are flowcharts showing the operation of the real chip simulation section of the present embodiment;

DESCRIPTION OF THE PREFERRED EMBODIMENTS a) Aspect of the Invention:

An aspect of the present invention will be described with reference to FIG. 1.

Figure 1:
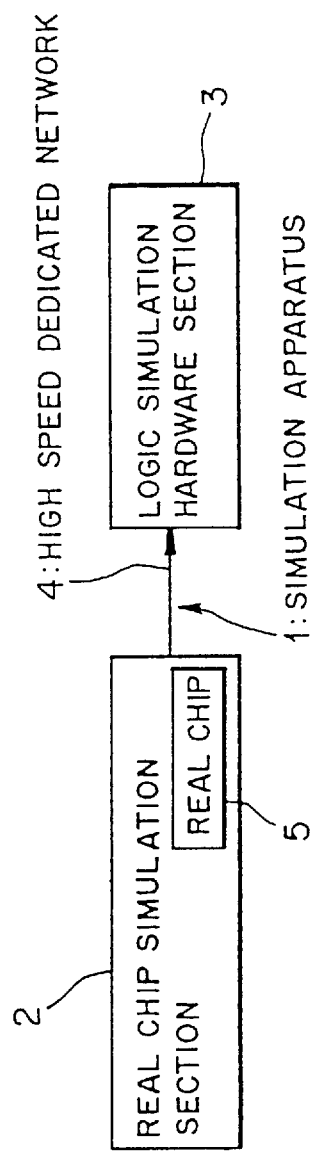
FIG. 1 is a block diagram illustrating an aspect of the present invention.

FIG. 1 is a block diagram showing the aspect of the present invention. In FIG. 1, numeral 1 denotes a simulation apparatus for simulating a logic circuit including a portion having an unknown internal logic. The simulation apparatus 1 comprises a real chip simulation section 2, a logic simulation hardware section 3, and a high speed dedicated network 4.

A real chip 5 having a portion whose internal logic is unknown is mounted on the real chip simulation section 2. The real chip simulation section 2 drives the real chip 5 to simulate the portion having an unknown internal logic. The logic simulation hardware section 3 simulates a portion of the logic circuit whose internal logic is described.

The high speed dedicated network 4 connects the real chip simulation section 2 and the logic simulation hardware section 3 to transmit event data between them.

Since the event data are transferred through the high speed dedicated network 4 which connects the real chip simulation section 2 and the logic simulation hardware section 3, the time required for transmission and reception of event data can be shortened.

The logic simulation hardware section 3 may be formed by a plurality of processor elements, and a communication network, serving as the high speed dedicated network 4, which performs high speed data transmission among the processor elements. In this case, the portion of the logic circuit whose internal logic is described is divided into a plurality of partial circuits, which are allotted to the respective processor elements. Each of the processor elements simulates a partial circuit allotted thereto. An arbitrary one of the plurality of processor elements constituting the logic simulation hardware section 3 is replaced with the real chip simulation section 2, and the real chip simulation section 2 is connected to the communication network.

Accordingly, the portion of the logic circuit whose internal logic is described is simulated by the processor elements, and the portion having an unknown internal logic is simulated by the real chip simulation section 2 through the communication network (high speed dedicated network 4).

In this case, an interface between the real chip simulation section 2 and the communication network may have the same structure as an interface between the processor elements and the communication network. With this structure, the real chip simulation section 2 can be mounted on the simulation apparatus 1 as the same hardware element as the processor elements forming the logic simulation hardware section 3.

The real chip simulation section 2 may comprise a data form conversion section, a pattern memory section, and a pin electronics section, as well as a real chip section on which the real chip 5 is mounted.

The data form conversion section converts event data which are transferred from the processor elements through the communication network into data having a data form suitable for the real chip 5 and converts event data from the real chip 5 into data having a data form suitable for the processor elements.

The pattern memory section holds, as time-series history data of input events, event data which are transferred from the processor elements through the communication network after the initiation of simulation of the logic circuit.

When the real chip 5 is simulated, the pin electronics section reads out the history data of input events from the pattern memory section and successively supplies the history data to the real chip 5 to reproduce the internal logic of the real chip 5. Also, the pin electronics samples event data from the real chip 5 as an output event.

By forming the real chip simulation section 2 in the above-described manner, event data (input event) from the processor elements are converted into data of a format suitable for the real chip 5 by the data form conversion section, and are stored into the pattern memory section together with all past event data as time-series data.

When the history data of input events in the pattern memory section are successively output from the pin electronics section to the real chip 5 from the beginning of the data, the internal logic of the real chip 5 is reproduced. The event data (output event) from the real chip 5 which are obtained as a result of the supply of the history data are sampled by the pin electronics section.

The sampled event data are converted into data having a data form suitable for the processor elements by the data form conversion section, and are transferred to the logic simulation hardware section (processor elements) 3.

The data form conversion section may be of the type which provides two-way conversion between parallel data suitable for the real chip 5 and serial data suitable for the processor elements.

One minimum processing unit (primitive) is generated for each of the input and output pins of the real chip 5 which is mounted on the real chip simulation section 2, thereby obtaining a simulation model of the real chip 5. As to bidirectional input/out pins of the real chip 5 mounted on the real chip simulation section 2, one minimum processing unit is generated for each of the input direction and the output direction of each bidirectional pin so as to obtain the simulation model of the real chip 5.

With this structure, the portion which is simulated by the real chip simulation section 2 and the portion which is simulated by the logic simulation hardware section 3 are combined in the simulation model of the logic circuit, thereby providing a unified simulation model. Therefore, it is possible to express the real chip by using the same expression as that used for an ordinary model.

When minimum processing units are generated as described above, the relationship of connection among the minimum processing units of the simulation model is determined in the logic simulation hardware section 3 based on element numbers which have been given to the processor elements in advance, and the minimum processing unit numbers which have been given to the respective minimum processing units processed in the respective processor elements in advance. Also, an element number corresponding to the element numbers of the processor elements is given to the real chip simulation section 2 in advance, and minimum processing unit numbers are allotted to the minimum processing units which are generated for the respective pins of the real chip 5. Accordingly, the relationship of connection between the minimum processing units generated for the respective pins of the real chip 5 in the real chip simulation section 2 and the minimum processing units in the logic simulation hardware section 3 can be determined based on the element numbers and the minimum processing unit numbers.

The real chip simulation section 2 may have a structure such that it performs simulation in parallel with the logic simulation hardware section 3 when event data are given from the logic simulation hardware section 3 to a previously designated arbitrary trigger pin among the input pins of the real chip 5 in the real chip simulation section 2. With this structure, it becomes unnecessary to wait the completion of simulation of the real chip 5 after the logic simulation hardware section 3 sends out event data for the real chip 5.

A delay value is set in advance to determine the period of time starting when event data are given from the logic simulation hardware section 3 to an arbitrary trigger pin of the real chip 5 in the real chip simulation section 2 and ending when an output event of the real chip 5 which is the result of the simulation of the real chip 5 is transferred from the real chip simulation section 2 to the logic simulation hardware section 3.

After providing event data, the logic simulation hardware section 3 performs simulation processing independent of the processing of the real chip simulation section 2 for a period of time which is set as the delay value. Also, the real chip simulation section 2 performs simulation processing independent of the processing of logic simulation hardware section 3 until an output event of the real chip 5 is determined.

The structure may be modified such that when the period of time set as the delay value has elapsed, or when an output event of the real chip 5 has been determined if the output event has not been determined at that time, the output event of the real chip 5 is transferred, as event data, from the real chip simulation section 2 to the logic simulation hardware section 3 via the high speed dedicated network 4.

With this structure, at a proper time during the operation of the real chip simulation section 2, the result of the simulation performed by the real chip simulation section 2 (output event of the real chip 5) is securely transferred to the logic simulation hardware section 3 which operates in parallel with the real chip simulation section 2.

The real chip section which forms the real chip simulation section 2 may be formed by a connecting mechanism for connecting a hardware device serving as the real chip 5 (real part whose internal logic is unknown or a device which is formed by at least one component and which realizes an arbitrary logic function) and a pin electronics section, and a protecting function section which allows the whole of the real chip section including the hardware device to be removably connected to the real chip simulation section 2 in a state where electricity is supplied.

Even when the entire chip section including the hardware device (real chip) is inserted into the real chip simulation section 2 or is removed therefrom when the simulation apparatus is in operation (i.e., when an electrical power is supplied), the level of the voltage is adjusted by the protecting function section, thereby preventing the real chip simulation section 2 from being adversely affected.

Also, a device which can reproduce its internal logic without receiving history data of input events (e.g., SRAM, PLD, FPGA) may be mounted, as the real chip 5, on the real chip section of the real chip simulation section 2. When the simulation of that real chip 5 is performed, event data from the processor elements are directly supplied to the real chip 5 by the pin electronics section. Accordingly, it becomes unnecessary to hold event data from the processor elements in the pattern memory section as the history data of input events.

Moreover, the pin electronics section of the real chip simulation section 2 may include a signal generating section for generating data, which are the same as the data in the pattern memory section, at timing independent of the speed at which the history data of input events are read out from the pattern memory section, and for outputting the data to the real chip 5 as an input event. Also, the pin electronics section of the real chip simulation section 2 may include a signal generating section for generating a pulse signal which has an arbitrary phase, period and pulse width which are different from those of the history data of input events in the pattern memory section, and for outputting the pulse signal to the real chip 5 as an input event.

With this structure, it becomes possible to provide event data to the real chip 5 without using the data in the pattern memory section, thereby reducing the amount of useless event data held in the pattern memory section.

Also, in the pattern memory section of the real chip simulation section 2, a portion which holds history data corresponding to each pin of the real chip 5 may be initialized using an initial value corresponding to each pin, and be arbitrarily divided in a history direction (address direction) and in a pin direction (data direction), and each of the divided portions of the pattern memory section may be operated independently as a pattern memory section. With this structure, although the real chip 5 is only one, the real chip 5 can be regarded as a plurality of chips which can be independently operated as chips on a plurality of models or as chips corresponding to a plurality of histories.

Moreover, the pattern memory section may additionally comprise a control section having a control function for reading out history data of input events from the pattern memory section in a time-series order, and a control function for repeatedly reading out part of the history data of input events from a continuous area of the pattern memory section. The continuous area continues from an arbitrary stating point to an arbitrary ending point.

In this case, the history data of input events in the pattern memory section are usually read out by the former control function in a time-series order. However, when periodical event data such as a clock signal is supplied to the real chip 5, only event data corresponding to a minimum unit of the pattern memory section is held in the pattern memory section. In this case, the latter control function is used to repeatedly read out data (event data corresponding to the minimum unit) from a continuous area, which continues from an arbitrary starting point to an arbitrary ending point, so as to provide the real chip 5 with periodical event data.

The real chip simulation section 2 may be provided with a real chip drive/control section. When a period of time which is previously set as a delay value elapses after the real chip drive/control section receives an input event from the logic simulation hardware section 3, the real chip drive/control section operates to transfer, as a simulation result, an output event of the real chip 5 from the real chip simulation section 2 to the logic simulation hardware section 3 via the high speed dedicated network 4.

With the function of the real chip drive/control section, at a proper time during the operation of the real chip simulation section 2, the result of the simulation performed by the real chip simulation section 2 (output event of the real chip 5) is securely transferred to the logic simulation hardware section 3 which operates in parallel with the real chip simulation section 2.

Also, the pattern memory section may be provided with a control section which can arbitrarily change the data readout position or the data write-in position of the pattern memory section for a previously designated specific event among input events input to the real chip simulation section 2 and output events from the real chip 5.

When such a control section is added, it becomes possible to read out arbitrary event data from the pattern memory section and to supply them to the real chip 5. Also, it becomes possible to write event data from the real chip 5 (output event) into the pattern memory section at an arbitrary position thereof and to hold them. In this case, the real chip simulation section 2 can operate the real chip having an unknown internal logic by itself without cooperating with the logic simulation hardware section 3, and store the result of the simulation of the real chip into the pattern memory section. Accordingly, the simulation apparatus can operate as a simulator dedicated for simulating the real chip for itself.

As described above, in the simulation apparatus 1 of the present invention, a real chip simulation can be performed without hindering the functions of a hardware accelerator (logic simulation hardware section 3) which performs high speed simulation. In addition, since the portion for driving the real chip 5 is directly built into the portion where operation for the simulation is performed, the time required for the transmission and reception of events can be shortened, so that the speed of the simulation can be increased.

Also, a minimum processing unit (primitive) is generated for each pin of the real chip 5 and the simulation model is obtained in only a simulation performing module, thereby obtaining a unified model. Accordingly, the simulation model including the real chip 5 can be simulated in the same manner as that for an ordinary software model.

When the logic simulation hardware section 3 sends out event data for the real chip 5, the logic simulation hardware section 3 can operate in parallel with the real chip simulation section 2 without waiting the completion of the simulation of the real chip 5. Also, when a period set as a delay value elapses after the real chip simulation section 2 receives event data, an output event of the real chip 5 is transferred to the logic simulation hardware section 3. This increases the processing speed of the simulation.

Even when the entire real chip section including the real chip 5 is inserted into the real chip simulation section 2 or is removed therefrom when the simulation apparatus is in operation, the level of the voltage is adjusted by the protecting function section, thereby preventing the real chip simulation section 2 from being adversely affected.

Also, when a real chip 5 which can reproduce its internal logic without receiving the history data of input events is mounted on the real chip portion of the real chip simulation section 2, the pin electronics section can supply event data from the processor elements directly to the real chip 5. Accordingly, the real chip 5 can easily be simulated without holding in the pattern memory section the event data from the processor elements as history data of input events.

Moreover, since the pin electronics section of the real chip simulation section 2 includes various signal generating sections, it becomes possible to provide event data to the real chip 5 without using the data in the pattern memory section, thereby reducing the amount of useless event data held in the pattern memory section. Accordingly, the capacity of the pattern memory section can be utilized effectively.

Also, when the pattern memory section of the real chip simulation section 2 is divided into a plurality of areas for use, the real chip 5 can be regarded as a plurality of chips which independently operate on a plurality of models although the real chip 5 is only one. Accordingly, simulations for various simulation models or simulations based on different histories can be performed in parallel with each other.

Moreover, since data can be repeatedly read out from a continuous area of the pattern memory section, from an arbitrary starting point to an arbitrary ending point, and can be supplied to the real chip 5 as periodical event data, event data corresponding to the minimum unit are required to be held in the pattern memory section when periodical event data are to be supplied to the real chip 5. Accordingly, the capacity of the pattern memory section can be utilized effectively.

Also, with the function of the real chip drive/control section, the result of simulation performed by the real chip simulation section 2 is transferred, at a proper time during the operation of the real chip simulation section 2, to the logic simulation hardware section 3 which operates in parallel with the real chip simulation section 2. This increases the processing speed of the simulation.

Moreover, it is possible to read out arbitrary event data from the pattern memory section and to supply them to the real chip 5, and to write event data from the real chip 5 into the pattern memory section at an arbitrary position thereof and to hold them. Accordingly, the real chip simulation section 2 can be used by itself to perform the simulation of the real chip 5.

b) Embodiment of the Invention:

A preferred embodiment of the present invention will now be described with reference to the accompanying drawings.

First, the basic structure and processing operation (modeling, etc.) of a simulation apparatus according to the present embodiment will be described with reference to FIG. 2 through FIG. 8.

Figure 2:
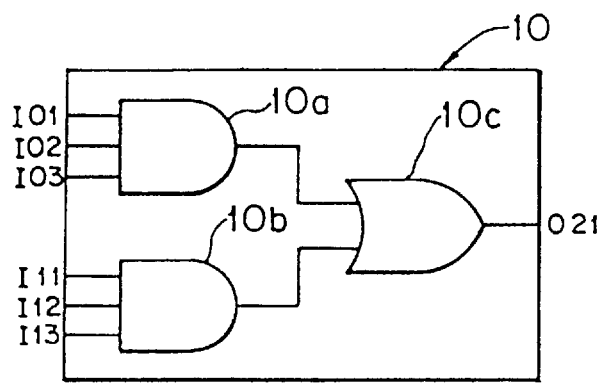
FIG. 2 is a block diagram showing an example of a circuit to be simulated which has a known internal logic.
Figure 3:
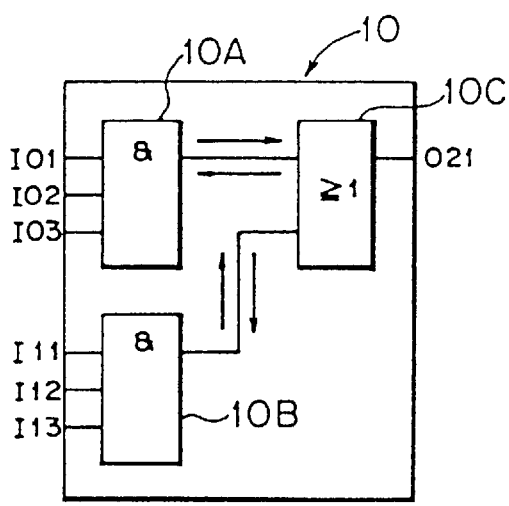
FIG. 3 is a block diagram showing a simulation model of the circuit shown in FIG. 2.
Figure 7:
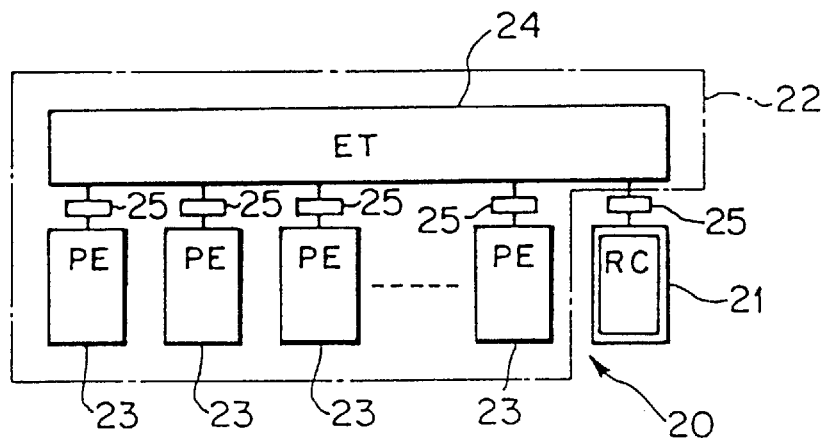
FIG. 7 is a block diagram showing the basic structure of a simulation apparatus according to the embodiment of the present invention.
Figure 9:
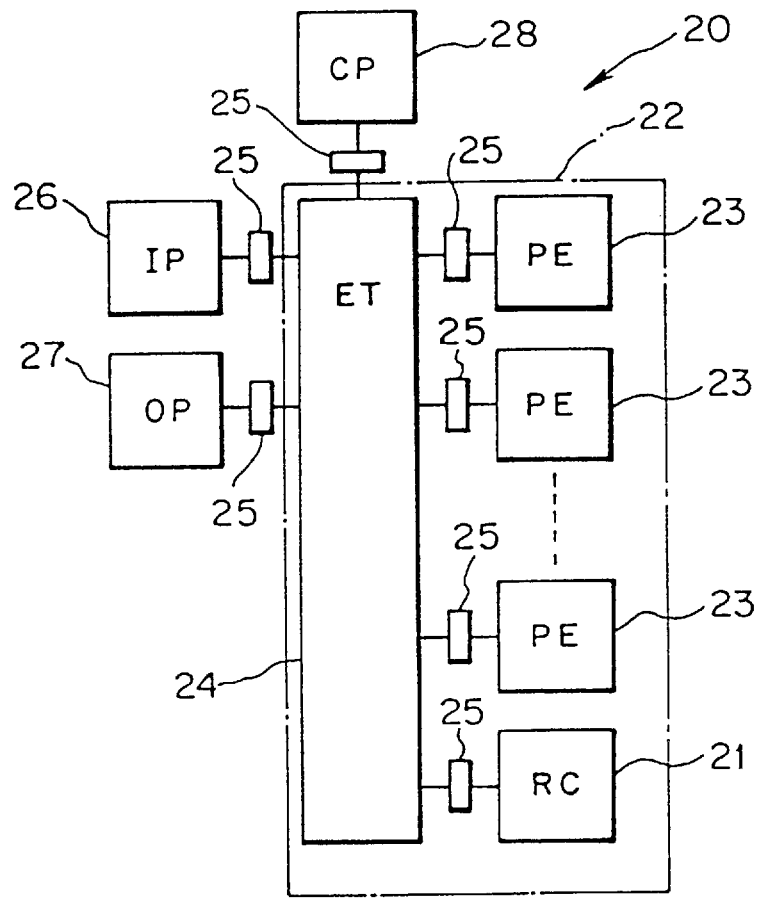
FIG. 9 is a block diagram showing the concrete structure of the simulation apparatus according to the embodiment of the present invention.

FIG. 2 and FIG. 3 are used for explaining a modeling method according to the present embodiment, in which a circuit to be simulated (circuit having a known internal logic) is simulated on a logic simulation hardware section (hardware accelerator; indicated by symbol 22 in FIG. 7 and FIG. 9). FIG. 2 is a block diagram showing an example of the circuit having a known internal logic which is to be simulated.

A circuit 10 shown in FIG. 2 has a know internal logic. The circuit 10 includes an AND gate 10a which outputs the logical product of three inputs I01, I02 and I03, an AND gate 10b which outputs the logical product of three inputs I11, I12 and I13, and an OR gate 10c which outputs the logical sum of outputs from the AND gates 10a and 10b. In FIG. 2, symbol O21 denotes the output of the circuit 10 (i.e., OR gate 10c).

FIG. 3 shows a simulation model obtained from the circuit 10 shown in FIG. 2. In FIG. 3, symbols 10A, 10B and 10C denote primitives which are minimum processing units for which simulation is performed. These primitives 10A–10C correspond to the AND gates 10a and 10b and the OR gate 10c shown in FIG. 2, respectively. Arrows in FIG. 3 indicate fan-in and fan-out directions.

In the simulation model as shown in FIG. 3, information on the connection among the primitives 10A–10C is expressed by using primitive numbers (minimum processing unit numbers) given to the primitives 10A–10C. Each of the primitive numbers is unique in the model.

Usually, an upper limit is set for the number of input and output signals of each primitive to efficiently perform modeling operation on the logic simulation hardware section. A logic block having input and output signals whose number exceeds the upper limit is modeled by combining a plurality of primitives. For example, since the circuit 10 shown in FIG. 2 is regarded as an AND/OR gate having six inputs and one output, the circuit 10 is formed by three primitives 10A–10C. A part having a known internal logic is modeled by the above-described primitives, and simulation is performed using such a model.

Figure 4:
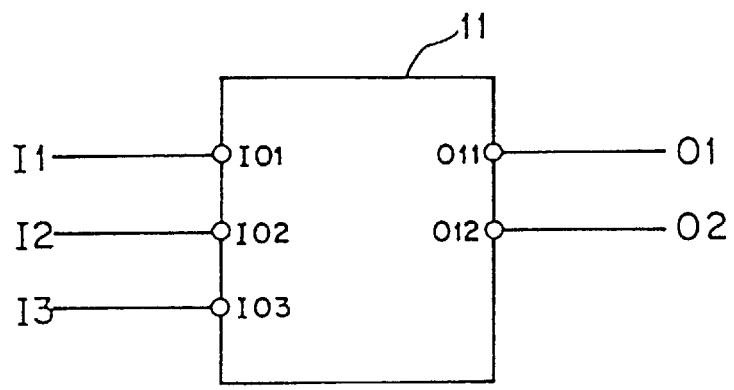
FIG. 4 is a block diagram showing an example of a real chip to be simulated which has an unknown internal logic.
Figure 5:
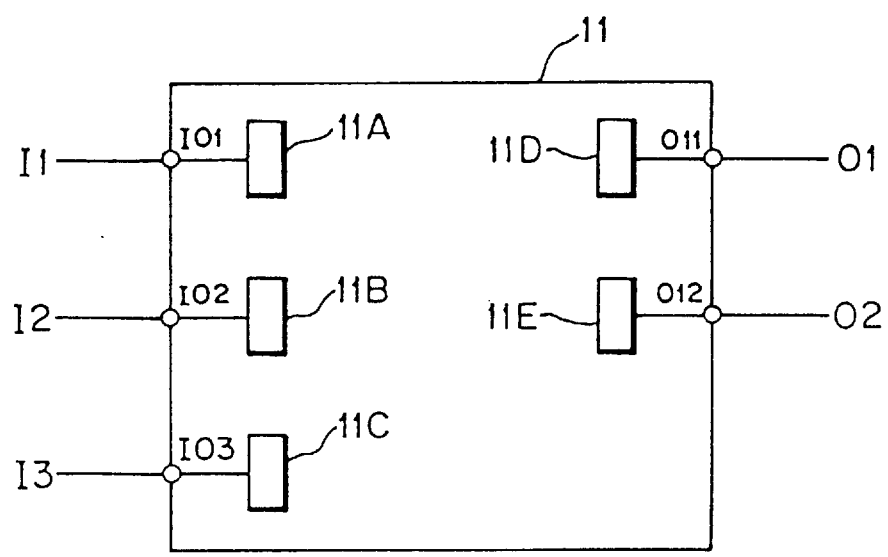
FIG. 5 is a block diagram showing a simulation model of the real chip shown in FIG. 4 which is obtained in accordance with an embodiment of the present invention.

FIG. 4 and FIG. 5 are used for explaining a modeling method in the present embodiment which is performed for a part having an unknown internal logic. FIG. 4 is a block diagram showing an example of a real chip (part) having an unknown internal logic which is to be simulated.

A real chip 11 having an unknown internal logic, shown in FIG. 4, has input pins I01–I03 for receiving three input signals I1–I3, and output pins O11 and O12 for outputting two output signals O1 and O2, respectively.

FIG. 5 shows a simulation model obtained from the real chip 11 shown in FIG. 4. In the present embodiment, as shown in FIG. 5, the real chip 11 having an unknown internal logic is modeled by generating primitives 11A–11E, each having one input or one output, for the pins I01–I03 and O11, O12. Thus, the real chip 11, which is a single part, is expressed by a group of plural (5 in this embodiment) primitives 11A–11E.

That is, the input pins I01–I03 and the output pins O01 and O02 in FIG. 4 correspond to the input pins I01–I03 and the output pins O01 and O02 in FIG. 5, respectively. By establishing the correspondence between the pins I01–I03 and O01, O02 and the primitives 11A–14E, respectively, the real chip 11 having an unknown internal logic is modeled to provide a simulation model thereof.

By the modeling as described above, the processing for propagating events between a part (real chip 11) having an unknown internal logic and another part having a known internal logic (ordinary primitive) can be performed in the same manner as the ordinary processing for propagating events between parts each having a known internal logic.

Also, the real chip 11 having an unknown internal logic, which is expressed by the plurality of primitives 11A–11E, is treated in the same manner as that for other primitives (primitives which are obtained by modeling parts each having a known internal logic) by using an evaluation apparatus dedicated for such a real chip (real chip simulation section which will be described later).

Here, operation of a part having an unknown internal logic is considered. When the part having an unknown internal logic is a microprocessor unit (MPU) or a similar part, input pins and output pins of the part can be categorized into groups having different characteristics. Pins belonging to the first group are trigger pins. When the logical value supplied to each of such trigger pins changes (i.e., when an event is generated), the internal status of the part changes. An example of such trigger pins is a pin to which a clock signal is input. Pins belonging to the second group are data pins. The events for such data pins themselves do not cause changes in the internal status of the part. An example of such data pins is a pin to which a data bus signal is input. Due to these characteristics, events for such data pins can be ignored in so far as an event is not generated at a trigger pin.

When considering a part having an unknown internal logic as a single black box, the internal status of the part can be reproduced by holding all input values as time-series data when an event is generated at a trigger pin, and successively providing in a time-series order the held values at the same timing as that when the values are input. The real chip simulation section (indicated by symbol 21 in FIG. 7 and FIG. 9) operates based on this principle.

When logical simulation of a part such as an MPU, which operates synchronously with a signal (clock signal) input to a specific input pin, is performed, the simulation processing for that part can be performed independent of the simulation processing for other primitives (circuits each having a known internal logic) until the next event is given to the trigger pin.

Figure 6:
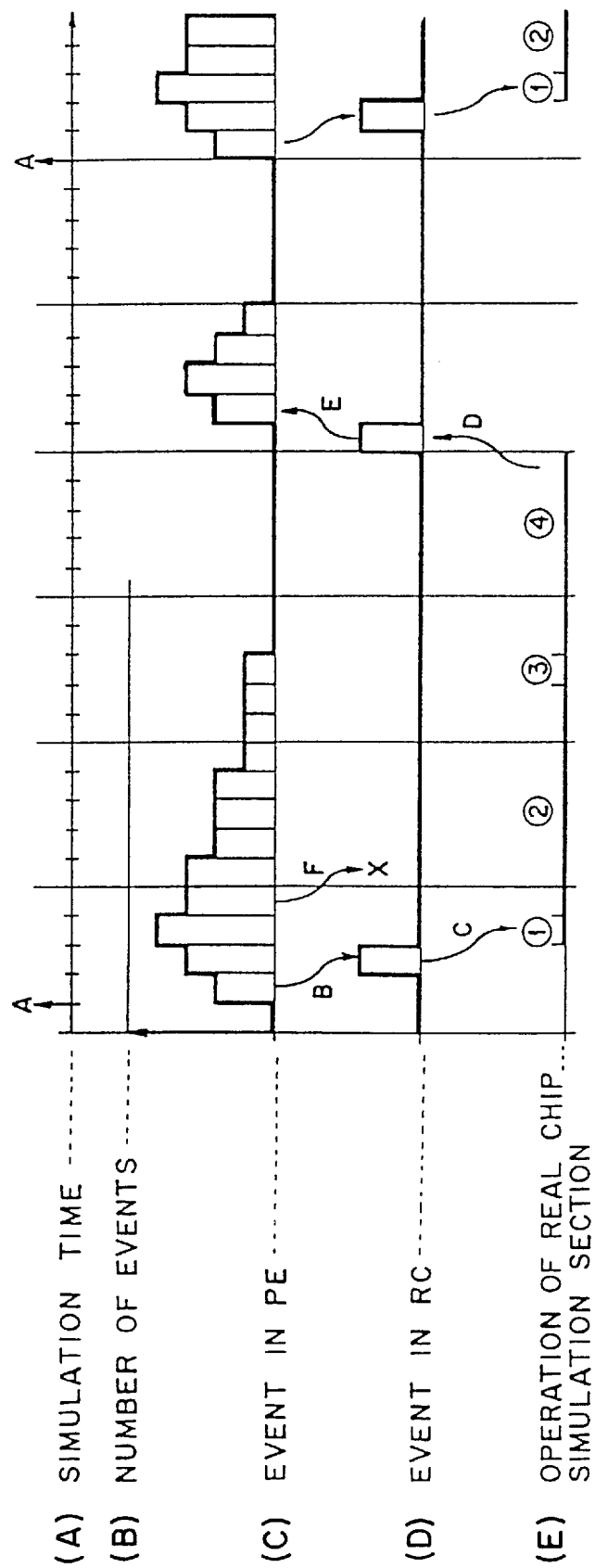
FIG. 6 is a time chart showing the elapse of time during simulation and operational statuses in the simulation apparatus of the embodiment.

FIG. 6 shows simulation time and operational statuses (the number of generated events, etc.) in the simulation apparatus of the present embodiment. In FIG. 6, the elapse of time during the simulation, the number of events generated in processor elements (PEs indicated by symbol 23 in FIG. 7 and FIG. 9), which constitute the logic simulation hardware section, the event generation status in the real chip simulation section, and the operational status of the real chip simulation section are illustrated from the top to the bottom.

In FIG. 6, symbol A indicates a time when a clock event is generated in the simulation model, symbol B indicates timing when an event is transferred from the processor elements to the real chip simulation section, symbol C indicates timing when a trigger event is detected in the real chip simulation section to drive the real chip, symbol D indicates timing when sampling data from the real chip is sent into the real chip simulation section, and symbol E indicates timing when an output event from the real chip is transferred to other processor elements. Symbol F indicates timing when an event is transferred from the processor elements when the real chip simulation section is in operation. Since the real chip simulation section is in operation at that time, the event transferred from the processor elements is not accepted by the real chip simulation section.

In the bottom portion of FIG. 6 which shows the operational status of the real chip simulation section, ① indicates timing when an input event is written into the pattern memory section (indicated by symbol 32 in FIG. 8), ② indicates the operational period of the real chip, ③ indicates timing when an output value (output event) from the real chip is sampled, and ④ indicates a waiting period before outputting the output event.

Next, the basic structure of a simulation apparatus 20 according to the present embodiment will be described with reference to FIG. 7. As shown in FIG. 7, the simulation apparatus 20 according to the present embodiment is basically formed by a real chip simulation section (sometime simply referred to as "RC (Real Chip)" in the drawings) 21, a plurality of processor elements (sometime simply referred to as "PEs") 23, and a high speed dedicated network (ET (Event Transfer) network; simply referred to as "ET" in the drawings) 24.

The plurality of PEs 23, and the ET network 24 (communication network such as a data bus in an actual apparatus) which perform high speed data transmission among the PEs 23 constitute a logic simulation hardware section (hardware accelerator) 22. The logic simulation hardware section 22 simulates the modeled circuit 10 shown in FIG. 3 (i.e., a portion of a logic circuit whose internal logic is described). The portion whose internal logic is described is divided into a plurality of partial circuits depending on the scale of the logic circuit to be simulated, and the partial circuits are allotted to the PEs 23. Each of the PEs 23 simulates a partial circuit allotted thereto.

The real chip simulation section 21 is an apparatus dedicated for simulating the portion whose internal logic is unknown and which is modeled as shown in FIG. 5. A real chip (indicated by symbol 36 in FIG. 8) which forms the portion having an unknown logic is mounted on the real chip simulation section 21. The real chip simulation section 21 drives the real chip to simulate the portion having an unknown internal logic. An arbitrary one of the PEs 23 forming the logic simulation hardware section 22 is replaced with the real chip simulation section 21, and the real chip simulation section 21 is connected to the ET network 24.

In the present embodiment, as have been described with reference to FIG. 2–FIG. 5, the connection between the portion having a known internal logic and the portion having an unknown internal logic can be expressed in the same manner as that for the connection between ordinary primitives. Accordingly, as shown in FIG. 7, an interface which is the same as an interface (PE-ET event interface) 25 between each PE 23 and the ET network 24 can be used as an interface between the real chip simulation section 21 and the ET network 24. That is, the real chip simulation section 21 can be connected to the ET network 24 as the same hardware element as the PEs 23, which form the logic simulation hardware section 22, so as to be mounted on the simulation apparatus 20.

With this structure, simulation for the portion whose internal logic is described is performed by the PEs 23. When an event for the portion having an unknown internal logic (real chip) is generated, event data indicating the event is transferred to the real chip simulation section 21 via the ET network 24. Simulation for the portion having an unknown internal logic (real chip) is performed in the real chip simulation section 21, and the result of the simulation (output event of the real chip) is transferred from the real chip simulation section 21 to the PEs 23 via the ET network 24.

As described above, by connecting the real chip simulation section 21 to the ET network 24 in the same manner as that for the PEs 23, event data can be transferred at a high speed to reduce the transmission and reception time of events. Accordingly, simulation for a circuit to be simulated (logic circuit) including a portion having an unknown internal logic (real chip) can be performed at a high speed.

Figure 8:
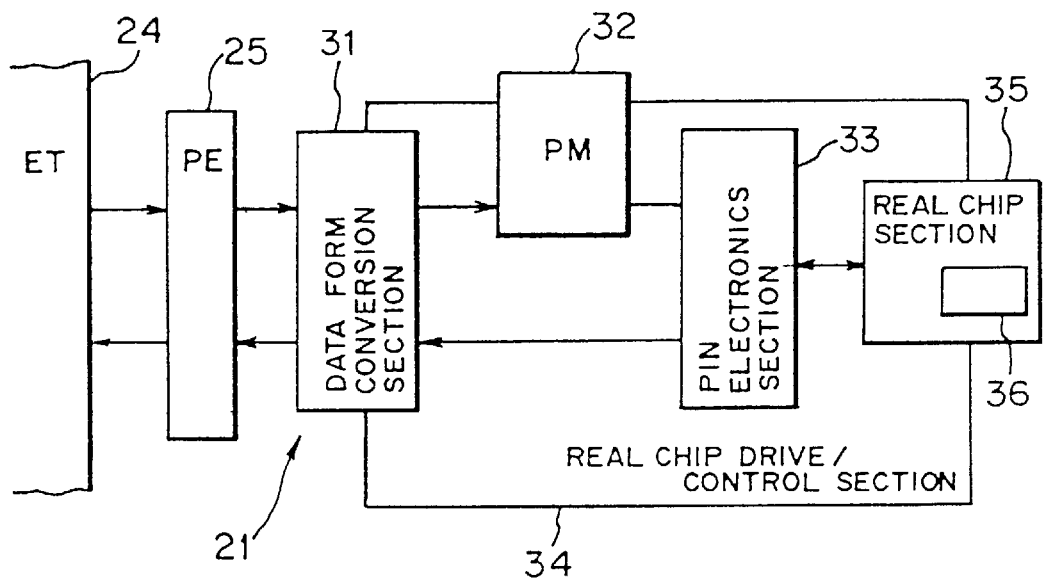
FIG. 8 is a block diagram showing the basic structure of a real chip simulation section of the simulation apparatus according to the embodiment of the present invention.

Also, as described above, the real chip simulation section can reproduce history data of input events for the portion having an unknown internal logic (real chip) so as to reproduce the internal status of the portion having an unknown internal logic (real chip). For this purpose, the real chip simulation section 21 comprises not only a real chip section 35, on which a real chip 36 is mounted, but also a data form conversion section 31, a pattern memory section (PM) 32, a pin electronics section 33, and a real chip drive/control section 34, as shown in FIG. 8. In the present embodiment, the interface 25 will be described as one of the elements of the real chip simulation section 21.

The data form conversion section 31 converts serial event data, which are transferred from the PEs 23 through the ET network 24 and the interface 25, into data having a data form (parallel) suitable for the real chip 5 and converts parallel event data from the real chip 36 into data having a data form (serial) suitable for the PEs 23. The provision of the data form conversion section 31 makes it possible to transfer event data between the real chip simulation section 21 and the PEs 23 through the ET network 24 and the interface 25. Accordingly, it becomes possible to simulate the real chip 36 as a portion having an unknown internal logic.

Event data which are transferred from the PEs 23 via the ET network 24 and the interface 25 after the initiation of simulation of the circuit (logic circuit) to be simulated are stored in the pattern memory section 32. The pattern memory section 32 holds such event data as time-series history data of input events.

When the real chip 36 is simulated, the pin electronics section 33 reads out the history data of input events from the pattern memory section 32 in a time-series order, and supplies them to the real chip 36 so as to reproduce the internal logic thereof. The pin electronics section 33 also samples event data from the real chip 36 as an output event.

The real chip drive/control section 34 controls the operational conditions of the real chip 36 to be simulated, manages the timing at which the result of the simulation output from the real chip 36 (output event) is transferred to the logic simulation hardware section 22 (PEs 23), and controls the transfer of the output event.

That is, as have been described as the status ④ shown in FIG. 6 (detailed description will be made later in relation to FIG. 18), the real chip drive/control section 34 has a function of transferring an output event of the real chip 36 to the PEs 23 via the interface 25 and the ET network 24, as the result of simulation, when a period of time set as a delay value elapses after an input event is received from the PEs 23.

Since the real chip simulation section 21 has the above-described structure, event data (input events) from the PEs 23 are converted, by the data form conversion section 31, into data having a data from suitable for the real chip 36, and are stored in the pattern memory section 32 together with all past event data as time-series data.

When the pin electronics section 33 reads out the history data of input events in the pattern memory 32 from the beginning thereof and supplies them to the real chip 36 of the real chip section 35 in a time-series order, the internal logic of the real chip 36 is reproduced. Event data (output events) from the real chip 36 which are obtained as a result of the simulation are sampled by the pin electronics section 33.

The sampled event data are converted, by the data form conversion section 31, into data having a data from suitable for the PEs 23, and are transferred, at a proper timing, to the PEs 23 via the interface 25 and the ET network 24 by the function of the real chip drive/control section 34.

As described above, since the reading out of input events from the pattern memory section 32 and the timing at which the pin electronics section 33 sends out input events to be supplied to the real chip 36 are controlled, various simulations can be performed to cope with various parts (real chip 36) whose internal logic are unknown. Also, in order to transfer an output event of the real chip 36 to a primitive (PE 23) connected thereto at a proper timing during the simulation, the propagation of the output event sampled by the pin electronics section 33 is controlled by the real chip drive/control section 34. Accordingly, an arbitrary trigger pin can be set.

Next, the detailed structure and operation of a simulation apparatus according to the present embodiment will be described with reference to FIG. 9 through FIG. 27.

FIG. 9 is a block diagram showing the concrete structure of the simulation apparatus according to the embodiment of the present invention. In this drawing, the same symbols as those already described denote the same portions, and description therefor will be omitted.

The simulation apparatus 20 of the present embodiment shown in FIG. 9 has mostly the same structure as that shown in FIG. 7. However, an input event processor (IP) 26, an output event processor (OP) 27, and a control processor (CP) 28 are added to the structure shown in FIG. 7. These processors are connected to the ET 23 via the interface 25.

The input event processor 26 supplies the simulation apparatus 20 with input events. The output event processor 27 processes output events generated in the simulation apparatus 20. The control processor 28 carries out synchronous control for the processors (real chip simulation section 21, PEs 23, processors 26 and 27) which constitute the simulation apparatus 20.

Figure 10:
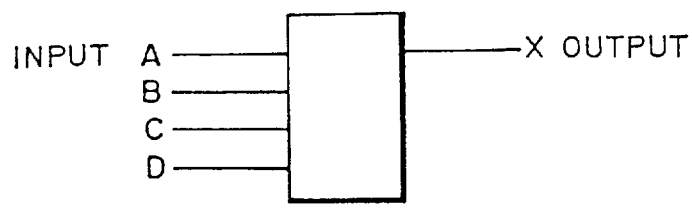
FIG. 10 is a block diagram showing an example of a primitive in the present embodiment.

FIG. 10 is a block diagram showing an example of a primitive (minimum processing unit), which is a minimum unit which can be processed in the PEs 23 (logic simulation hardware section 22) of the present embodiment. In the present embodiment, the primitive is defined such that it has four inputs (A–D) and one output (X), as shown in FIG. 10.

Each PE 23 has a function of logically converting input values of the primitive to obtain an output value, thereby performing simulation. In the present embodiment, a circuit to be simulated is expressed by using the primitive shown in FIG. 10, thereby converting it into a form which can be processed by each PE 23. By allotting primitives to a plurality of PEs 23, the logic simulation hardware section 22 can be obtained in which simulations for the circuit to be simulated are performed in parallel.

Figure 11:
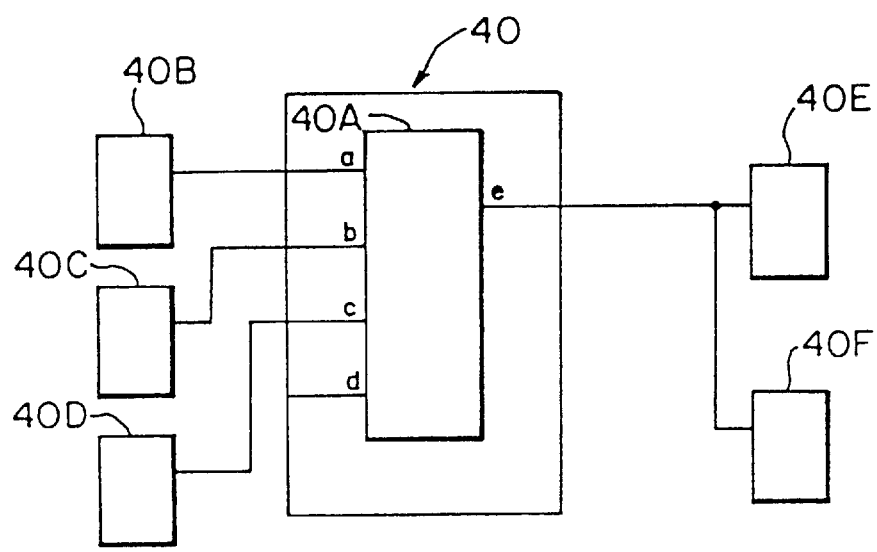
FIG. 11 is a block diagram showing an example of a circuit (circuit having a known internal logic) to be simulated which is expressed by the primitive of the present embodiment.

FIG. 11 is a block diagram showing an example of a circuit (circuit having a known internal logic) to be simulated which is expressed by the primitive of the present embodiment. In FIG. 11, a logic gate 40 having three input terminals and one output terminal is expressed by the primitive 40A shown in FIG. 10 which has four inputs (a–d) and one output (e). Input d is treated as an unused terminal.

As described above, a circuit to be simulated (logic gate 40 ) is converted to be expressed by primitives. Each primitive has a PE number (element number) which is set and given to each PE 23, and a primitive number which is set and given to each primitive within each PE 23, so that each primitive is uniquely expressed in the simulation apparatus 20. Moreover, the connection between primitives can be expressed by designating the fan-in and fan-out of each primitive by using the primitive number thereof.

When a change occurs in the input values of a primitive, an output value of the primitive is evaluated based on the input values and the logical function of the primitive to obtain the output value. When the output value changes, it means that an event is generated. The destination of the event is determined based on the fan-out, and the destination-side primitive is evaluated. Each PE 23 performs the transfer of events and the evaluation of primitives in the above-described manner. When the destination of an event is another PE 23 (or the real chip simulation section 21), the source-side PE 23 outputs the event to transmit it to the destination-side PE 23 via the ET network 24.

Figure 12:
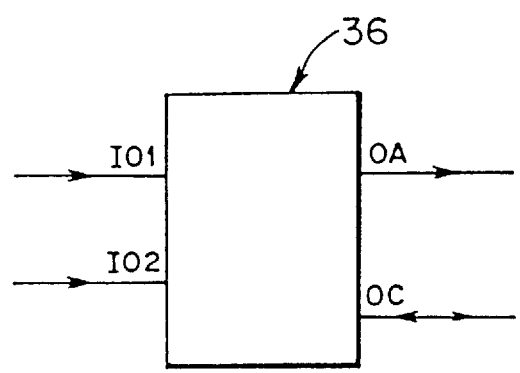
FIG. 12 is a block diagram showing an example of a real chip having an unknown internal logic.

FIG. 12 is a block diagram showing an example of a part having an unknown internal logic (real chip), and FIG. 13 is a block diagram showing the result which is obtained by expressing the real chip (circuit to be simulated) of FIG. 12 using the primitive according to the present embodiment.

The real chip 36 shown in FIG. 12 has two input pins I01 and I02, one output pin OA, and one bidirectional input/output pin OC.

As shown in FIG. 13, the input pins I01 and I02 of such a real chip 36 are made to correspond to primitives 41A and 41B, respectively, and events transferred from other PEs 23 are received by the primitives 41A and 41B. By relating the fan-out of a primitive 41A and 41B which has received an event to a physical pin of the real chip 36, the event for the primitive 41A or 41B is converted into an event for each pin I01 or I02 of the real chip 36.

The primitive 41C is allowed to the output pin OA of the real chip 36. The value at the output pin OA is converted to obtain an output value of the primitive 41C, so that the value at the output pin OA is expressed as a change of a value in the model. With this operation, the real chip 36 is converted into a form which can be treated in the same manner as that for primitives of other PEs 23.

Here, the case of the bidirectional input/output pin OC is considered. The propagation of an event in simulation is expressed by a propagation in a single direction from the output of a source-side primitive to the input of a destination-side primitive. Therefore, as to the bidirectional input/output pin OC, its input direction and output direction are separated from each other, and primitives 41D and 41E corresponding to these directions are generated to express the bidirectional input/output pin OC. That is, the bidirectional input/output pin OC shown in FIG. 12 is divided into an output pin OC and an input pin OC%I, as shown in FIG. 13, and the primitives 41D and 41E are generated for the pins OC and OC%I, respectively, to obtain a model.

Figure 14:
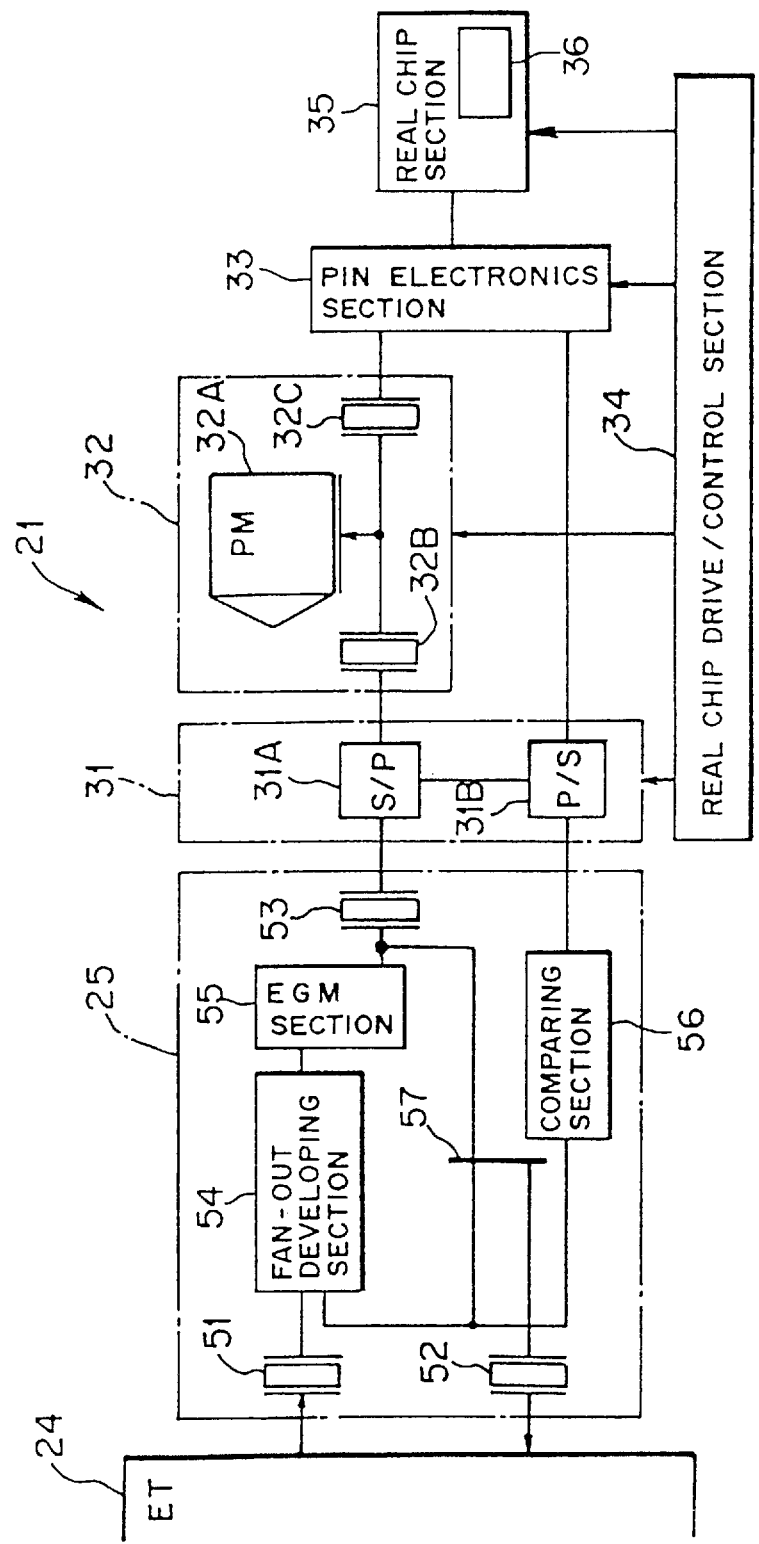
FIG. 14 is a block diagram showing the concrete structure of the real chip simulation section in the present embodiment.

FIG. 14 is a block diagram showing the concrete structure of the real chip simulation section in the present embodiment. In this drawing, the same symbols as those already described denote the same portions, and description therefor will be omitted.

The real chip simulation section 21 shown in FIG. 14 has mostly the same structure as that shown in FIG. 8. However, in FIG. 14, the structures of the interface 25, the data form conversion section 31, and the pattern memory section 32 are shown in more detail.

As shown in FIG. 14, the interface 25 treats events of primitives, which are transferred from the ET network 24 in the above-described manner, in the same manner as in the interfaces 25 of other PEs 23. The interface 25 in FIG. 14 converts an input event into an event to be supplied to a pin of the real chip 36 and outputs it to the event form conversion section 31. Also, the interface 25 receives an output value of the real chip 36 from the event form conversion section 31, as an event of a primitive, evaluates it as an event in a PE, and produces an event to be output to the ET network 24.

The interface 25 of the present embodiment is formed by registers 51–53, a fan-out developing section 54, an EGM (Evaluation Gate Memory) section 55, a comparing section 56, and a selector 57.

The register 51 temporarily stores event data transferred from the ET network 24. The register 52 temporarily stores event data to be sent out to the ET network 24. The register 53 temporarily stores a pin number of the real chip 36 (primitive information indicating a primitive to be evaluated next) to be sent out from the EGM section 55 to the data form conversion section 31.

The fan-out developing section 54 obtains a destination of an event by fan-out development based on event data from the ET network 24 in the same manner as in the interfaces 25 of other PEs 23. The EGM section 55 stores and registers the destination of the event, which has been obtained by the fan-out developing section 54, as a primitive to be evaluated next.

The comparing section 56 compares an output value from the real chip 36 and a previous output value held in a memory section such as a register (not shown) in the comparing section 56 to evaluate an event. The selector 57 selectively outputs primitive information from the EGM section 55 to the register 52 used for transmission to the ET network 24 or the fan-out developing section 54.

Figure 25:
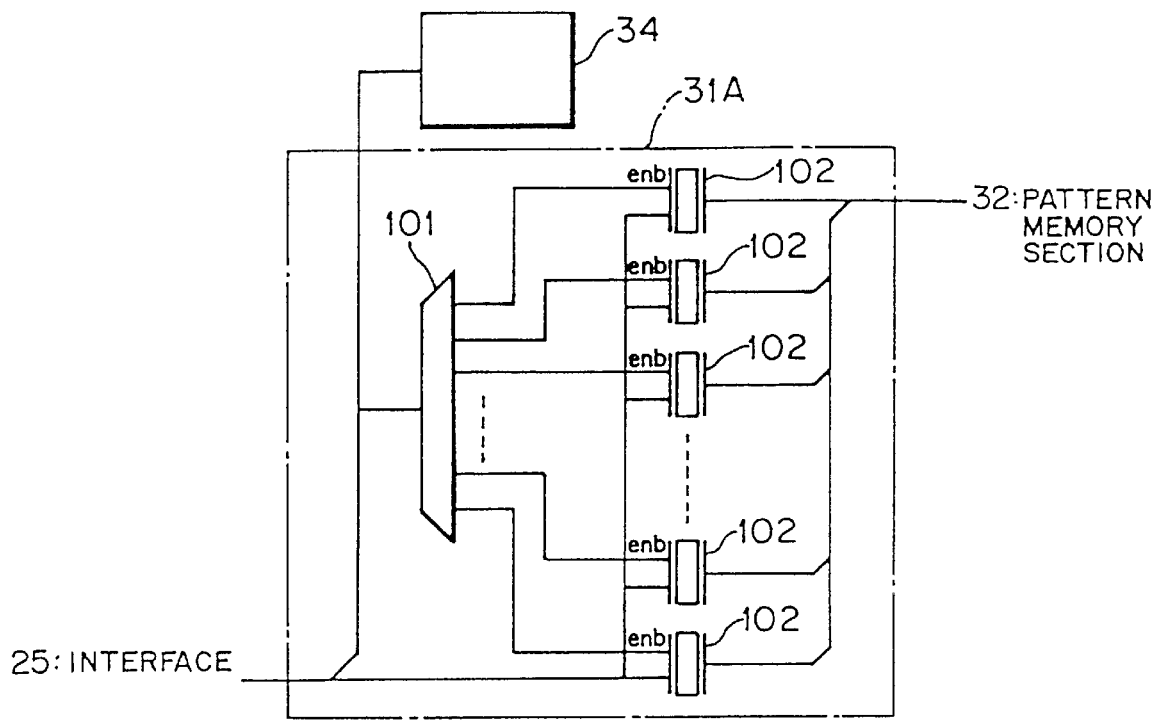
FIG. 25 is a block diagram showing the detailed structure of a serial/parallel conversion section in a data form conversion section of the present embodiment.
Figure 26:
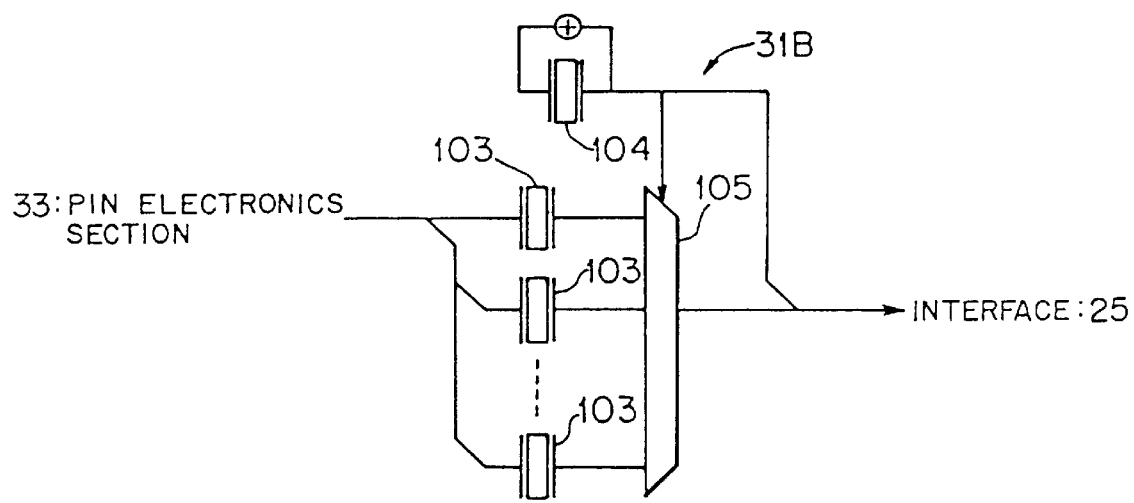
FIG. 26 is a block diagram showing the detailed structure of a parallel/serial conversion section in a data form conversion section of the present embodiment.

The data form conversion section 31 is formed by a serial/parallel (S/P) conversion section 31A, and a parallel/serial (P/S) conversion section 31B. The S/P conversion section 31A receives input pin event data of the real chip 36 which are serially output from the PE event interface 25, and converts the data to parallel data corresponding to the pins of the real chip 36. On the contrary, the P/S conversion section 31B converts output pin event data, which are sent out from the real chip 36 as parallel data, into an event of serial data corresponding to each primitive. The S/P conversion section 31A and the P/S conversion section 31B have structures as shown in FIG. 25 and FIG. 26, which will be described later.

As described above, the pattern memory section 32 stores, as time-series data, the history of the input pin event data of the real chip 36 which have been converted into a parallel form by the data form conversion section 31 (S/P conversion section 31A). In addition to a pattern memory 32A, the pattern memory section 32 comprises a register 32B for temporarily storing data to be written into the pattern memory 32A, and a register 32C for temporarily storing data read out from the pattern memory 32A. The pattern memory section 32 has a structure shown in FIG. 19 and FIG. 20, which will be described later. In the actual apparatus, an address control section 60 which will be described is additionally provided in the pattern memory section 32.

The pin electronics section 33 converts the input pin event data held in the pattern memory section 32 into data of a physical level suitable for the real chip 36 mounted on the real chip section 35 and supplies the converted data to the real chip 36. The pin electronics section 33 also samples data from the output pins of the real chip 36, extracts logical values from the data, and sends out them, as an output pin event of parallel data, to the data form conversion section 31 (P/S conversion section 31B).

The real chip drive/control section 34 controls the real chip 36, the pin electronics section 33, the pattern memory section 32, and the data form conversion section 31. The real chip drive/control section 34 has a function for controlling the operational conditions of the real chip 36, a function for managing timing of outputting event data, and a function for controlling the transfer of the event data.

The real chip section 35, on which the real chip 36 is mounted as mentioned above, comprises a connecting mechanism (real chip pin indicated by symbol 82 in FIG. 22) for connecting the real chip (hardware device) 36 and the pin electronics section 33, and a protecting function section (level adjusting circuit indicated by symbol 83 in FIG. 22) which allows the whole of the real chip section 35 including the real chip 36 to be removably connected to the real chip simulation section 21 in a state where electricity is supplied.

FIG. 15–FIG. 18 are flowcharts showing the steps of simulation performed in the real chip simulation section 21. The operation of the real chip simulation section 21 having the structure shown in FIG. 14 will be described with reference to these flowcharts.

In the interface section 25, as shown in FIG. 15, it is first judged whether there is an internal event (event to be processed in the real chip simulation section 21), i.e., whether the internal event is returned through the selector 57 (step S1). When there is no internal event, event data from the ET network 24 are accepted (step S2).

Event data transferred from the ET network 24 are input to the fan-out developing section 54 via the register 51, in the same manner as in the interfaces 25 of other PEs 23, so as to obtain a destination of propagation of the event by fan-out development. In detail, a fan-out pointer (FOP; not illustrated) is read out from the fan-out developing section 54 based on the event data (step S3). A destination of propagation of the event is read out from a fan-out memory (FOM; not illustrated) in the fan-out developing section 54 based on the pointer (step S4).

The read out information regarding the destination of the event (e.g., pin number of the real chip 36) is written into the EGM section 55, and is registered as a primitive to be evaluated next (step S5).

The processing in steps S4 and S5 is repeated until a last flag is read out from the fan-out memory (step S6).

Figure 16:
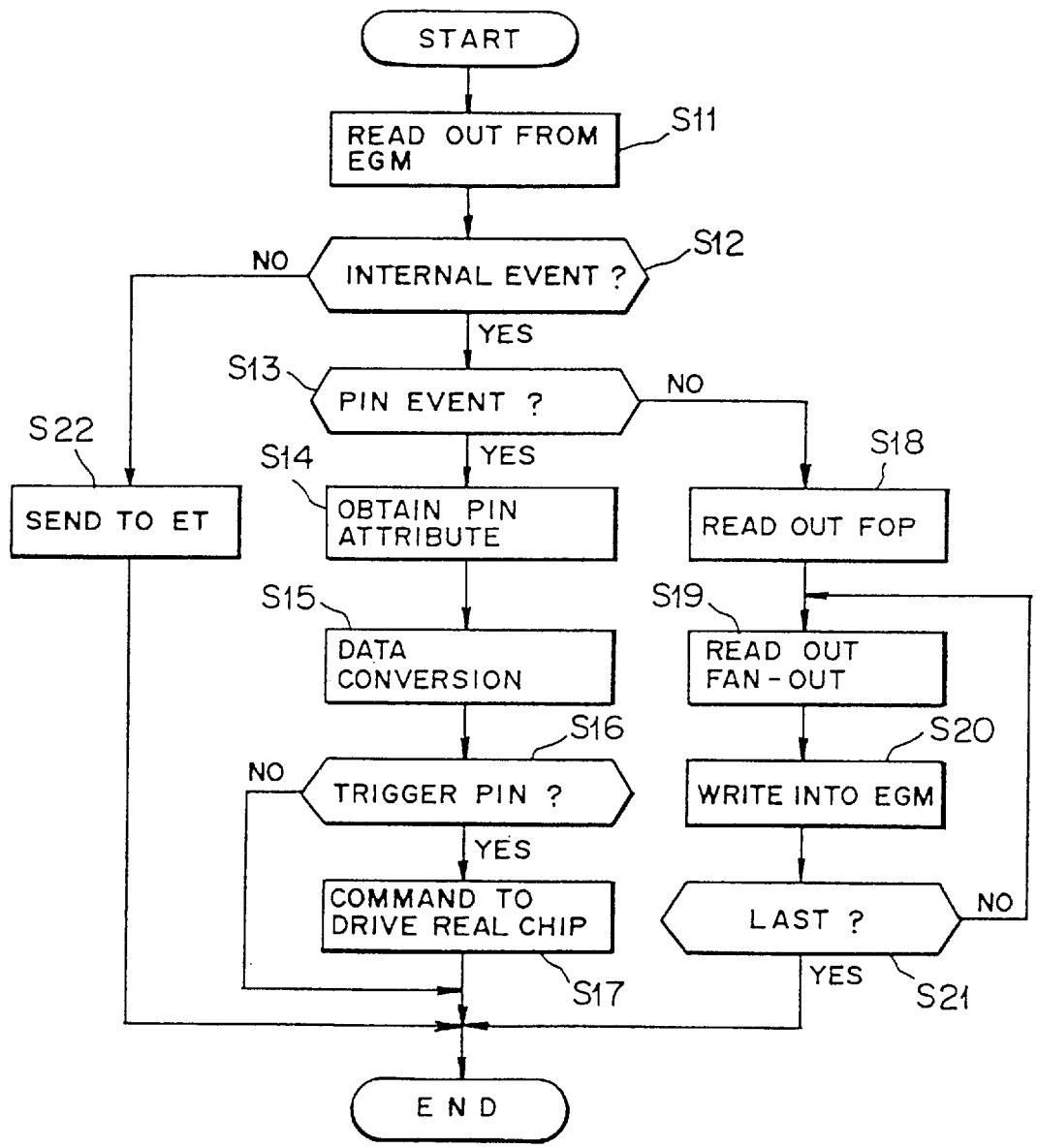

When a primitive to be evaluated at the present exists in the EGM section 55, as shown in FIG. 16, the primitive to be evaluated is read out from the EGM section 55 (step S11).

When the primitive to be evaluated is an ordinary primitive in a PE, i.e., when the primitive is an internal event and is not a pin event (when an affirmative judgment is made in step S12 and a negative judgment is made in step S13), the primitive is evaluated, and the selector 57 is switched to communicate with the fan-out developing section 54 so that the primitive is returned to the fan-out developing section 54 to carry out the fan-out development again.

That is, a fan-out pointer is read out from the fan-out developing section 54 based on the primitive by the same processing as the processing in steps S3 through S6, which has been described above with reference to FIG. 15, (step S18), and a destination of propagation of the event is read out from the fan-out memory based on the pointer (step 19). The read out information regarding the destination of the event is written into the EGM section 55, and is registered as a primitive to be evaluated next (step S20). The above-described processing in steps S19 and S20 is repeated until a last flag is read out from the fan-out memory (step S21).

Meanwhile, when the destination of propagation of the primitive to be evaluated, which is read out from the EGM section 55, is the real chip 36, i.e., when the primitive is a pin event for the real chip 36 (when an affirmative judgment is made in step S12 and an affirmative judgment is made in step S13), the primitive number is converted into a pin number of the real chip 36. After the attribute of the pin (information indicating whether a signal input to the pin changes the internal status of the real chip 36) is obtained (step S14), the result of the conversion is sent out to the data form conversion section 31 via the register 53.

The serial data, which are sent out to the data conversion section 31 in the above-described manner is converted, by the S/P conversion section 31A, into input pin event data of a parallel data form which is designated by the pin number of the real chip 36 (step S15). When the input pin event data represent an event for a previously designated trigger pin (when an affirmative judgment is made in step S16), this status is memorized, and a drive command for driving the real chip is output from the real chip drive/control section 34 (step S17).

When it is judged in step S12 that the primitive to be evaluated, which is read out from the EGM section 55, is not an internal event (when a negative judgment is made in step S12), it means that the primitive to be evaluated is an event for the outside (PEs 23). In this case, the selector 57 is switched to communicate with the register 52 so that the primitive to be evaluated is sent out to the ET network 24 via the register 52 as an output event from the real chip 36 (step S22).

Figure 17:
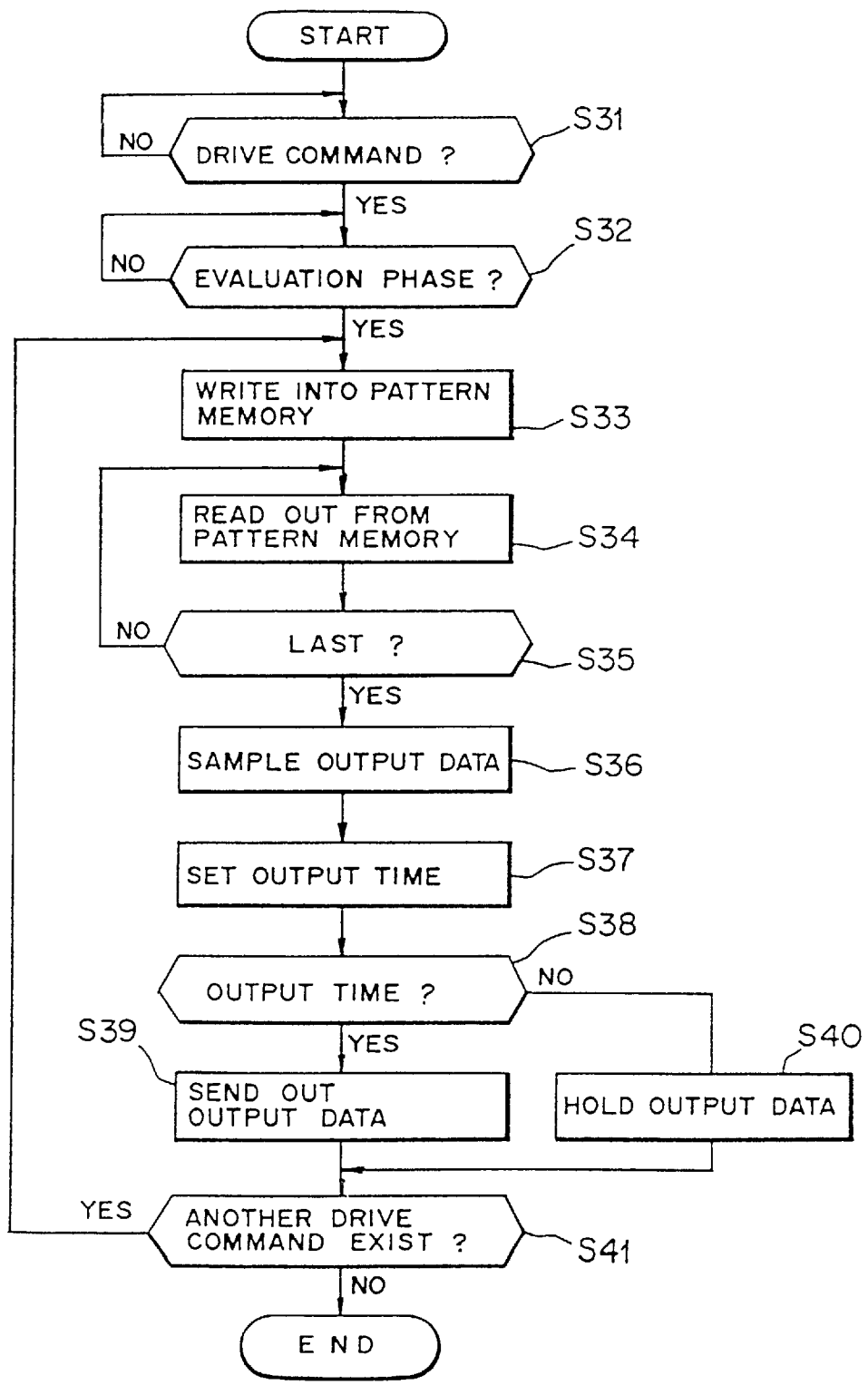

When the transmission of the input pin event data from the PE event interface 25 is completed, the event data are registered in the pattern memory section 32 in accordance with a command from the real chip drive/control section 34, as shown in FIG. 17. That is, when a drive command is output from the real chip drive/control section 34 in a state of waiting for the drive command from the real chip drive/control section 34 (when an affirmative judgment is made in step S31), it is judged whether the present is in an evaluation phase (step S32). When it is judged as being in the evaluation phase (when an affirmative judgment is made), the input pin event data of a parallel form from the data form conversion section 31 is written into the pattern memory section 32 and registered therein (step S33). After the registration, a waiting status is started to again receive an input pin event sent out from the PE interface 25.

Upon the reception of the input pin event data, the pattern memory section 32 reads out, in a time-series order, the history data from the pattern memory section 32 in accordance with a command from the real chip drive/control section 34, and supplies them to the real chip 36 in the real chip section 35 via the pin electronics section 33 (step S34).

When the last event is sent out from the pattern memory section 32, an output from the real chip 36 is sampled in the pin electronics section 33 synchronously with the output timing of the real chip 36 (step S36).

Subsequently, an output time corresponding to a delay value which is designated as a parameter of the simulation model is set (step S37). The sampled output value of the real chip 36 is managed by the real chip drive/control section 34 until the set output time comes (while a negative judgment is made in step S38). The sampled output value is converted into serial data by the P/S conversion section 31B of the data form conversion section 31, and is held (step S40).

When the output time comes (when an affirmative judgment is made in step S39), the output value of the real chip 36 is sent out from the data form conversion section 31 to the PE event interface 25 in a serial form.

After the output data are sent out, it is judged whether another drive command is output from the real chip drive/control section 34 (step S41). When another drive command exists, the processing moves back to step S33. When another drive command does not exists, the processing again goes into a waiting state to wait for a drive command from the real chip drive/control section 34.

Figure 18:
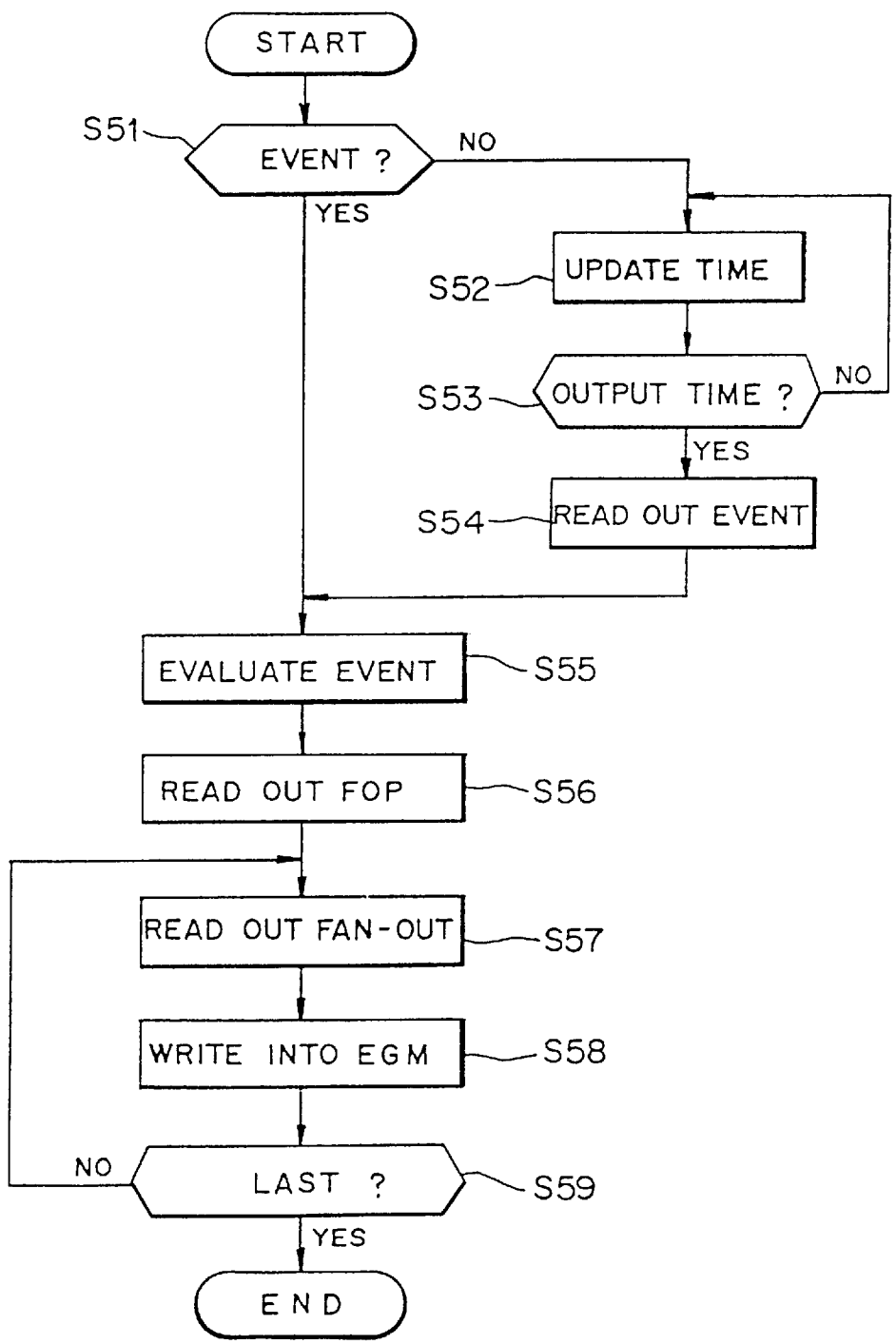

The processing for managing output time, holding output data, and sending out the output data, which has been described with reference to FIG. 17, will be described in more detail with reference to FIG. 18. In FIG. 18, the processing in steps S51 to S54 corresponds to the processing in steps S38 and S40 in FIG. 17 while the processing in steps S55 to S59 corresponds to the processing in step S39 in FIG. 17.

In the real chip drive/control section 34, it is first judged whether output data represent an event (step S51). Information of output time corresponding to a previously set delay value is added to the head of output event data which have not reached their output time yet. Therefore, such output event data are judged, in step S51, as being not an event. On the contrary, since information of output time is not added to the head of output event data which have reached the output time due to a delay in sampling an output value from the real chip 36, such output event data are judged as an event, in step S51.

Accordingly, when it is judged in step S51 that output data represent an event, the output data have reached their output time. In this case, output data of a serial form are sent out from the data form conversion section 31 to the PE event interface 25, and processing for transmitting the output data is immediately performed in step S55 and steps following thereto.

On the other hand, when it is judged in step S51 that the output data do not represent an event, the output time added to the head of the output data is updated (step S52), and it is judged whether the output time has come (step S53). When the output time has not come, the updating process in step S52 is repeated. When the output time has come, the output data of a serial form are sent out from the data form conversion section 31 to the PE event interface 25, as an event of a primitive in a PE (step S54), and the processing for transmitting the output data is immediately performed in step S55 and steps following thereto.

In the PE event interface 25, the event is evaluated by the comparing section 56 (step S55). That is, the comparing section 56 compares the output value from the real chip 36 and a previous output value held in the memory section such as a register in the comparing section 56. When the result of the comparison shows that no change has occurred in the output value, the output value is not transferred. However, when the result of the comparison indicates that a change has occurred in the output value, an output event is input to the fan-out developing section 54, in which a fan-out development is carried out by the same processing as those shown in steps S3 to S6 of FIG. 15 and in steps S18 to S21 of FIG. 16. The output event is then sent out to the ET network 24 as an event to be propagated to other PEs 23.

That is, a fan-out pointer is read out from the fan-out developing section 54 based on the output event (step S56), and a destination of propagation of the event is read out from the fan-out memory based on the pointer (step S57). The read out information regarding the destination of the event is written into the EGM section 55, and is registered as an output event to be sent out next (step S58). The above-described processing in steps S57 and S58 is repeated until a last flag is read out from the fan-out memory (step S59).

By switching the selector 57 to communicate with the register 52, the output event registered in the EGM section 55 is sent out to the ET network via the register 52 so that the output event is transferred to a predetermined PE 23.

Next, the structures and operations of the pattern memory section 32, the pin electronics section 33, the real chip drive/control section 34, and the data form conversion section 31 will be described in more detail.

Figure 19:
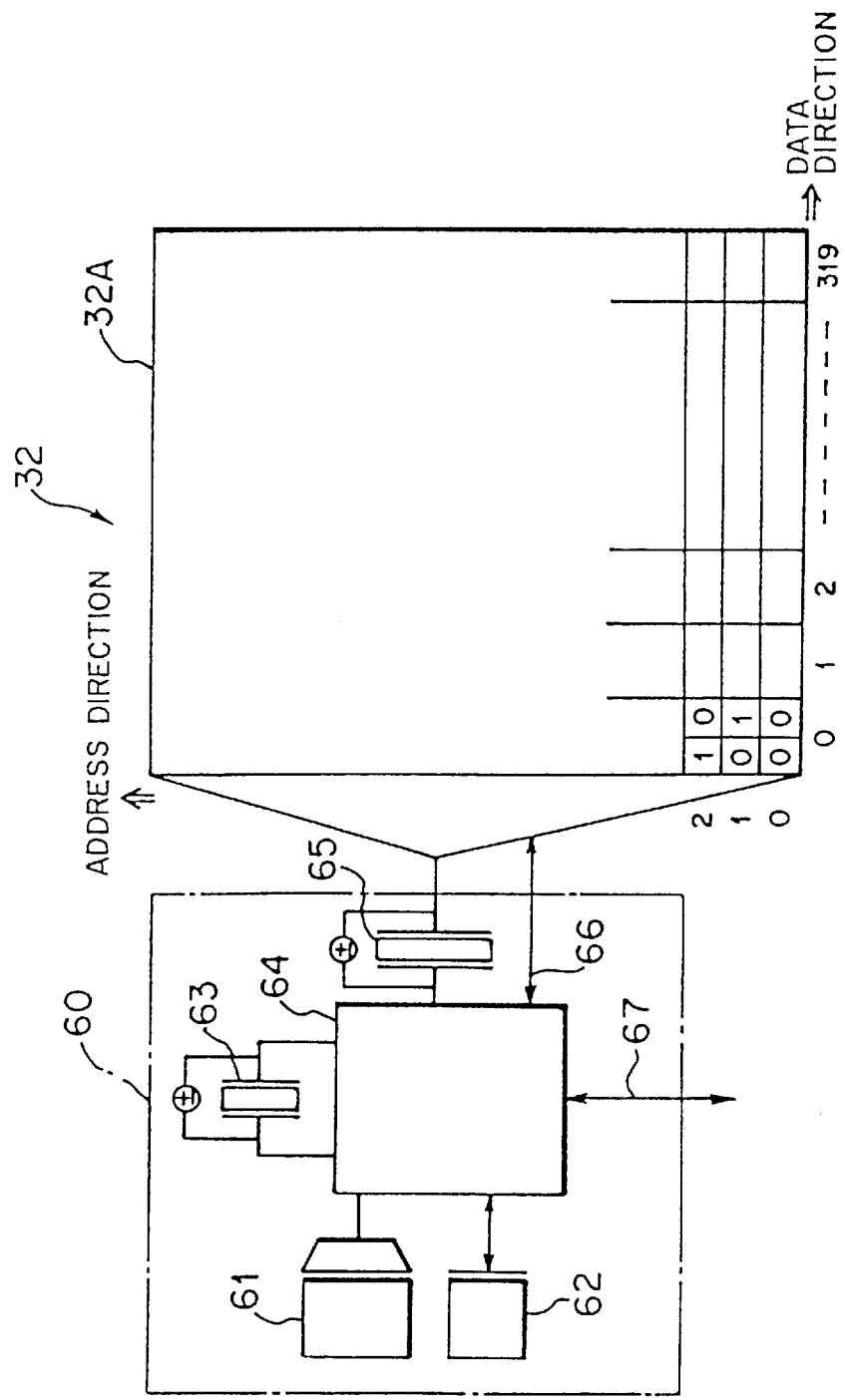
FIG. 19 is a block diagram showing in detail the basic structure of a pattern memory section in the real chip simulation section of the present embodiment.

FIG. 19 is a block diagram showing the basic structure of the pattern memory section 32 in the real chip simulation section 21 of the present embodiment. In FIG. 19, the registers 32B and 32C which have been described in relation to FIG. 14 are omitted. In this drawing, the same symbols as those already described denote the same portions, and description therefor will be omitted.

In FIG. 19, numeral 60 denotes an address control section added to the pattern memory 32A of the pattern memory section 32. The address control section 60 having various control functions which will be described later is formed by register groups 61 and 62, a control counter 63, a pattern memory control section 64, an address counter 65, a memory control signal line 66, and a synchronous control signal line 67.

Each of the register groups 61 and 62 holds reference data. For example, the register group 61 holds information regarding the division of the pattern memory 32A, and the register group 62 holds control information such as a recurrent loop and a jump which are necessary to perform read-out control and write-in control for the pattern memory 32A.

The control counter 63 is used when the pattern memory control section 64 performs the control functions as being described later. For example, when part of the history data of input events are repeatedly read out from a continuous area of the pattern memory 32A, which area continues from an arbitrary starting point to an arbitrary ending point, the control counter 63 functions as a loop counter for counting the number of repeated read-out operations (number of loops).

The pattern memory control section 64 realizes the below described control function by using information in the register groups 61 and 62, and the control counter 63. The address counter 65 holds a write-in address or a read-out address for the pattern memory 32A which is designated by the pattern memory control section 64.

Figure 20:
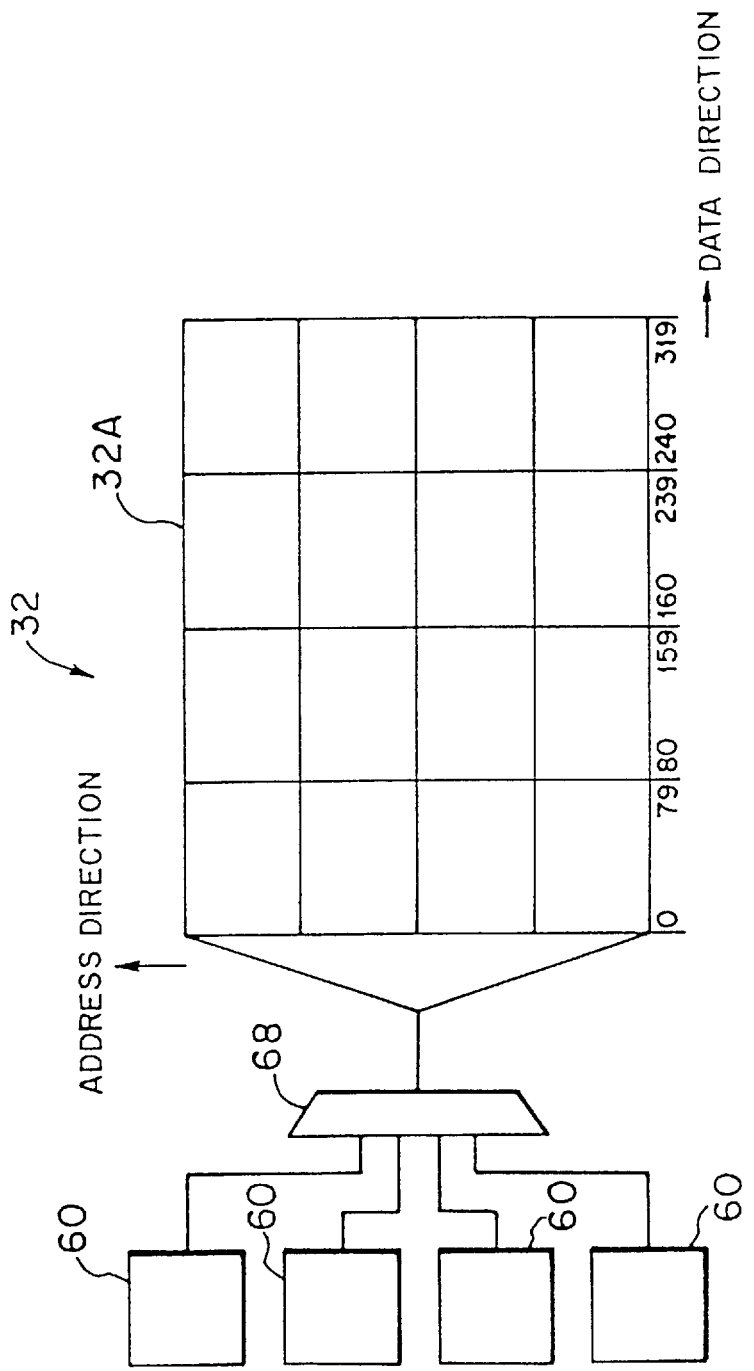
FIG. 20 is a block diagram showing a manner for dividing the pattern memory section in the real chip simulation section of the present embodiment.

The memory control signal line 66 is used for transferring control signals (write-in command, read-out command, etc.) from the pattern memory control section 64 to the pattern memory 32A. The synchronous control signal line 67 is used when a plurality of address control sections 60 are provided, as shown in FIG. 20. In such a case, the synchronous control signal line 67 transfers a synchronous control signal to synchronize these address control sections 60.

The pattern memory 32A holds values of pins of the real chip 36 as time-series data. As shown in FIG. 19, the address direction is a time axis (history direction), and the data direction corresponds to the pins of the real chip 36 (pin direction). The pattern memory 32A shown in FIG. 19 can hold, for example, logical values for 320 pins in the data direction.

The logical value of each pin is held as 2-bit data. Each bit can become H ("1"), L ("0"), or Z (high-impedance state). One of two bits for each pin indicates the kind of pin, i.e., an input pin, an output pin or a bidirectional input/output pin. The other bit indicates whether a pulse is to be output to that pin.

When an event such as a clock event is generated at a pin (trigger pin) which changes the internal status of the real chip 36, logical values of all the pins of the real chip 36 at the time n are written in the pattern memory 32A at an address corresponding to time n. The pattern memory 32A stores input values of all the pins whenever an event is generated at the trigger pin. Therefore, the simulation of the real chip 36 is carried out by reading out the logical values from time 0 to time n, and providing the logical values to the real chip 36 through the pin electronics section 33.

The addresses of the starting point and ending point of the area of the pattern memory 32A and the number of input values stored in the pattern memory 32A as history data are always held in the register group 62 as control information.

The address control section 60 having the above-described structure has a control function for reading out, in a time-series order, the history data of input events in the pattern memory section 32, and a control function for repeatedly reading out part of the history data of input events in the pattern memory section 32 from a continuous area from an arbitrary starting point to an arbitrary ending point based on the control information held in the register group 62.

Accordingly, during ordinary simulation, the history data of input events in the pattern memory section 32 are read out by the former control function in a time-series order. However, when periodic event data such as a clock signal are supplied to the real chip 36, event data corresponding to the minimum unit are only held in the pattern memory section 32. In this case, the latter control function is used to repeatedly read out data (event data corresponding to the minimum unit) from a continuous area of the pattern memory section 32, which continues from an arbitrary starting point to an arbitrary ending point. With this operation, periodical event data can be provided to the real chip 36.

That is, in the present embodiment, the pattern memory section 32 can be utilized effectively by controlling the address of the pattern memory 32A using the function of the address control section 60. Next, a description will be made of a concrete example of an operation for reading out the previously mentioned clock signal from the pattern memory section 32.

For example, when events are generated only at a trigger pin such as a pin for the clock signal and no event is generated at other pins, addresses of the pattern memory section 32 whose number is equal to the number of events generated at the trigger pin are used. This becomes apparent by considering the basic operation of the pattern memory section 32.

In the present embodiment, with a mechanism (register group 62) for holding an arbitrary address, an address comparator (function within the pattern memory control section 64) and the loop counter (control counter 63), when the present address of the pattern memory 32A coincides with the address held in the register group 62, the present address of the pattern memory 32A is changed to a different address which is separately held in the register group 62. With this operation, an event at the same address can be repeatedly read out until the count value of the loop counter reaches a predetermined value.

Accordingly, by storing event data corresponding to the minimum unit in the pattern memory 32A, the event data can be continuously and repeatedly read out and supplied to the real chip 36. Therefore, the capacity of the pattern memory section 32 can be utilized effectively. In the present embodiment, four kinds of boundary addresses can be held, and data can be read out from an arbitrary address of the pattern memory 32A.

FIG. 20 is a block diagram showing a manner for dividing the pattern memory section 32 in the real chip simulation section 21 of the present embodiment. In this drawing, the same symbols as those already described denote the same portions, and description therefor will be omitted.

A pattern memory 32A shown in FIG. 20 can also hold logical values for 320 pins in the data direction, as have been described in relation to FIG. 19. However, in the pattern memory 32A of the present embodiment, portion for holding history data corresponding to the pins of the real chip 36 is initialized in accordance with initial values corresponding to the pins, and that portion is arbitrarily divided in the history direction (address direction) and the pin direction (data direction). The divided portions of the pattern memory 32A are independently controlled by plural (four in FIG. 20) address control sections 60 such that each of the divided portions serves as a pattern memory.

That is, in the present embodiment, the pattern memory 32A can be divided into a plurality of areas in the data direction (pin direction) in accordance with the number of the pins of the real chip 36, and each area can be operated as an independent pattern memory. The pattern memory 32A of the present embodiment can be divided into a plurality of areas (up to four areas) each of which can store logical value for pins whose number is a multiple of 80. Information on the division is held in the register group 61, as have been described with reference to FIG. 19.

In the present embodiment, to control each of the divided portions of the pattern memory 32A, four address control sections 60, each having the same structure as that which has been described with reference to FIG. 19, are provided and are connected to the pattern memory 32A via a multiplexer 68. With this structure, each of the divided areas operates as a pattern memory.

Since the pattern memory 32A is divided in the pin direction (data direction), the real chip 36 can be regarded as chips which can be independently operated on plural (four in this case) simulation models although the real chip 36 is only one. Accordingly, it becomes possible to perform various kinds of simulations for the various kinds of simulation models in parallel.

The pattern memory 32A of the present embodiment has a structure such that it can be arbitrarily divided into a plurality of areas (up to four areas) in the address direction too. By dividing the pattern memory 32A in the history direction (address direction), the real chip 36 can be regarded as a plurality of chips which can be independently operated as chips corresponding to a plurality of histories.

Accordingly, it becomes possible to perform simulations corresponding to different histories in parallel.

Figure 21:
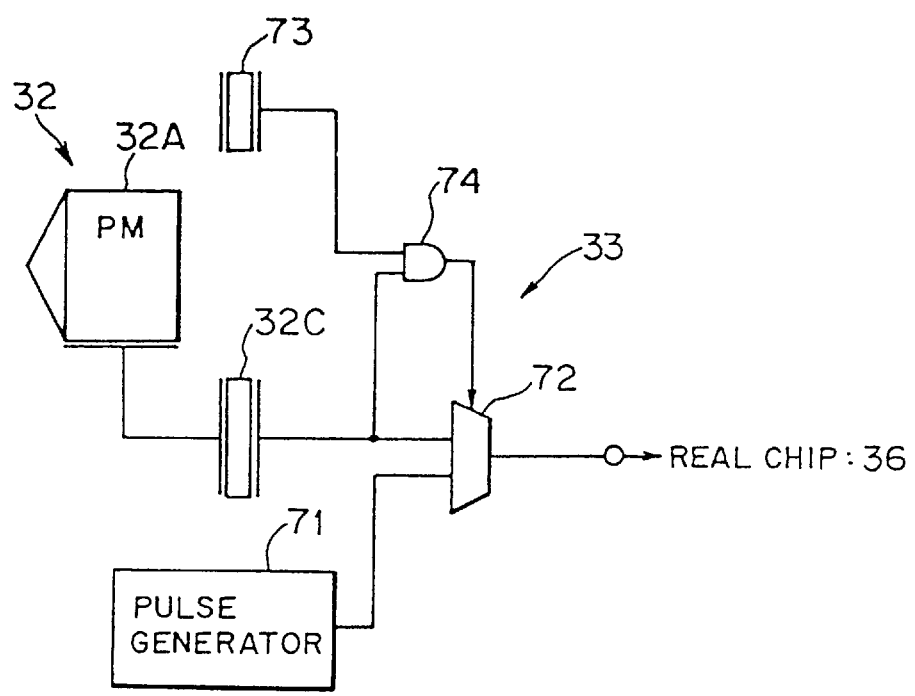
FIG. 21 is a block diagram showing an example of a system for inputting pulses into the real chip in the real chip simulation section of the present embodiment.

FIG. 21 is a block diagram showing an example of a system (basic structure) for inputting pulses into the real chip 36 in the real chip simulation section 21 of the present embodiment. In this drawing, the same symbols as those already described denote the same portions, and description therefor will be omitted.

In FIG. 21, numeral 71 denotes a pulse generator, numeral 72 denotes a selector, numeral 73 denotes a control flag (pin attribute) register, and numeral 74 denotes an AND gate. In real apparatus, the pulse generator 71, the selector 72, the control flag register 73 and the AND gate 74 are provided in the pin electronics section 33.

The pulse generator (signal generating section) 71 generates data, which are the same as the data in the pattern memory section 32, at timing independent of the speed at which the history data of input events are read out from the pattern memory section 32, and outputs the data to the real chip 36 as an input event. The pulse generator 71 generates a pulse signal which has an arbitrary phase, period and pulse width which are different from those of the history data of input events in the pattern memory section 32, and outputs the pulse signal to the real chip 36 as an input event.

The selector 72 selects the event data from the read-out register 32C of the pattern memory section 32 or the pulse signal from the pulse generator 71 and sends it to the real chip 36 as event data.

The control flag register 73 holds information regarding the above-mentioned pin attribute, i.e., information regarding the pins which change the internal status of the real chip 36. The AND gate 74 obtains the logical product of the pin attribute held in the control flag register 73 and the attribute of the input pin event data which have been read out to the register 32C of the pattern memory section 32 and which is to be output this time, and outputs the logical product to the selector 72.

In other words, in the present embodiment, only when the pin attribute in the control flag register 73 and the pin attribute of the pin to which the event data read out from the pattern memory section 32 is supplied coincide with each other, the output of the AND gate 74 becomes high, so that the selector 72 is switched to receive data from the pattern memory section 32. As a result, the event data read out from the pattern memory section 32 is supplied to the pin of the real chip 36. When both the pin attributes do not coincide with each other, the selector 72 is switched to receive a signal from the pulse generator 71. As a result, the pulse signal from the pulse generator 71 is supplied to the real chip 36, as a clock signal, for example.

Usually, in the pattern memory section 32, one address is used for each event of the trigger pin. However, since the pulse input system having the structure shown in FIG. 21 is employed, only event data which change internal status of the real chip 36 (only event data at the time when they have become high) are required to be held in the pattern memory section 32 in the case where the real chip 36 is synchronized at the rising edge of each clock or every two clocks.

That is, for pins other than the pins each having a pin attribute which is previously set in the register 73, the pulse signal from the pulse generator 71 is supplied to the real chip 36, as a clock signal or the like. On the other hand, event data for the trigger pin which are held in the pattern memory section 32 do not represent logical values but represent changes (transitions) of the events. To provide such changes to the real chip 36, as to a trigger pin of the real chip 36 having a pin attribute which is previously designated by the register 73, a pulse signal (event data) is supplied from the pattern memory section 32 to the trigger pin to operate the real chip 36.

With this structure, event data can be supplied to the real chip 36 without using the data in the pattern memory section 32. Accordingly, the amount of occupation of the pattern memory section 32 by useless event data can be reduced, and the capacity of the pattern memory section 32 can be utilized effectively.

Figure 22:
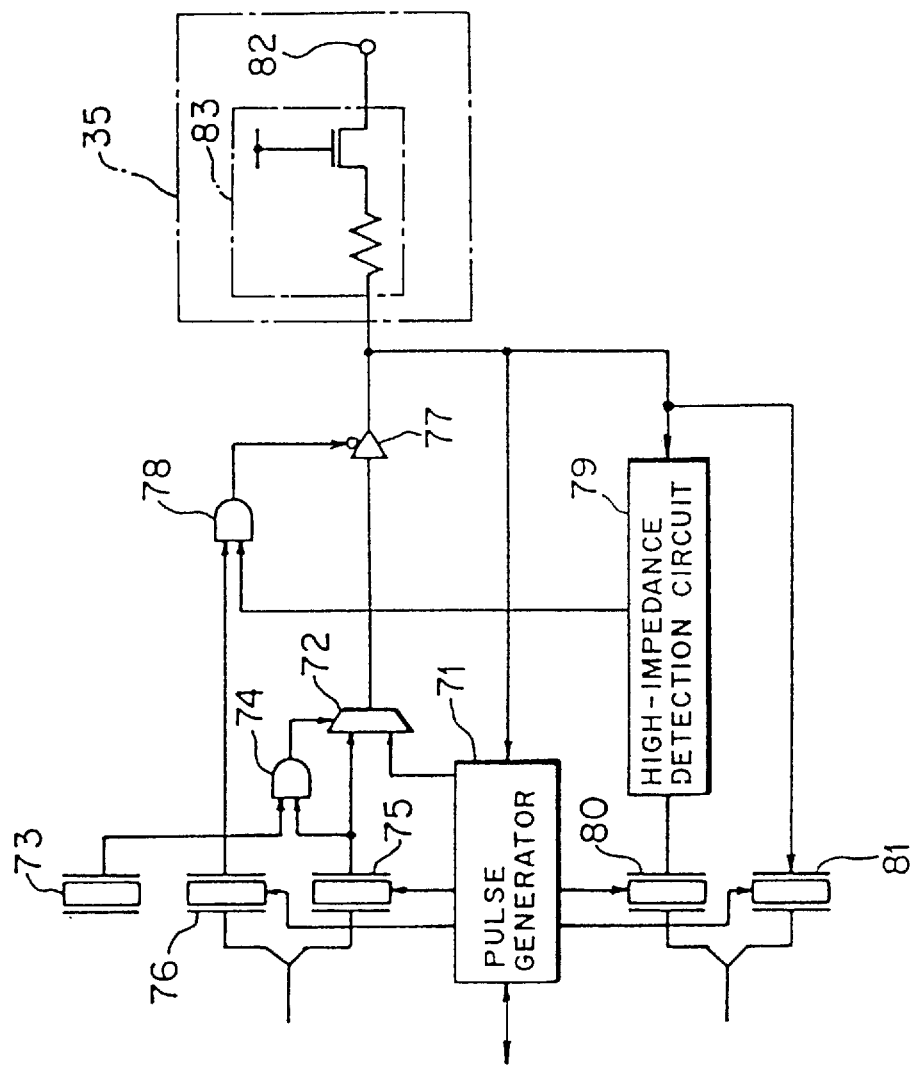
FIG. 22 is a block diagram showing in detail the basic structure of a pin electronics section in the real chip simulation section of the present embodiment.

FIG. 22 is a block diagram showing in detail the basic structure of the pin electronics section 33 in the real chip simulation section 21 of the present embodiment. In this drawing, the same symbols as those already described denote the same portions, and description therefor will be omitted.

The pin electronics section 33 shown in FIG. 22 comprises a pulse generator 71, a selector 72, a control flag register 73 and an AND gate 74 to provide the function which has previously been described in relation to FIG. 21. In addition to them, the pin electronics section 33 comprises registers (tristate buffers) 75 and 76, a transfer gate 77, an AND gate 78, a high-impedance detecting circuit 79, and registers (tristate buffers) 80 and 81.

The registers 75 and 76 hold tristate data read out from the pattern memory section 32. A value of H ("1") or L ("0") is held in the register 75 while a value of Z (high impedance state) is held in the register 76.

The transfer gate 77 is driven to open and close in accordance with a signal from the AND gate 78. The AND gate 78 calculates the logical product of a value in the register 75 and a detection signal from the high-impedance (Hi Z) detection circuit 79, and outputs the logical product to the transfer gate 77. The high-impedance detection circuit 79 detects whether a signal from the real chip 36 has a high impedance (Z).

When the value held in the register 75 is Z and the value from the real chip 36, which has been detected by the high-impedance detection circuit 79, is also Z, the output of the AND gate 78 becomes high, so that the transfer gate 77 is switched into a closed state. With this operation, data supplied to a bidirectional input/out pin of the real chip 36 is prevented from interfering with data returned from the real chip 36 through the input/out pin.

The registers 80 and 81 hold tristate data output from the real chip 36 (sampled output data of the real chip 36). A value of H ("1") or L ("0") is held in the register 80 while a value of Z detected by the high-impedance detection circuit 79 is held in the register 81. The values held in these registers 80 and 81 are sent out to the data form conversion section 31 as an output value (output event data) of the real chip 36.

The real chip section 35 on which the real chip 36 is mounted is connected to the above-described pin electronics section 33. The real chip section 35 comprises a real chip pin (connecting mechanism) 82, and a level adjusting circuit (protecting function section) 83. The real chip pin 82 is used for connecting the real chip (hardware device) 36 and the pin electronics section 33. The level adjusting circuit 83 allows the whole of the real chip section 35 including the real chip 36 to be removably connected to the real chip simulation section 21 (pin electronics section 33) in a state where electricity is supplied.

In the structure shown in FIG. 22, a pulse signal from the pulse generator 71 is also used as a clock signal for the timing adjustment of the structural elements of the pin electronics section 33.

With the structure as described above, the logical values supplied from the pattern memory section 32 can be latched in the registers 75 and 76, which are tristate buffers, to drive the real chip 36, thereby supplying the real chip 36 with the above-mentioned three kinds of signal values H, L and Z (tristate signals). Also, since the real chip 36 is driven via the transfer gate 77, it becomes possible to cope with a plurality of technologies such as TTL/LV-CMOS.

In the present embodiment, the timing of signals supplied to the real chip 36 is adjusted by using the pulse signal (predesignated pulse signal) from the pulse generator 71 as a timing pulse (clock signal) for latching data into the registers 75 and 76. The timing adjustment may be controlled by using the timing signal supplied from the real chip 36.

The sampling of an output value from the real chip 36 is performed by latching the output value by the registers 80 and 81 at sampling timing which is designated to each real chip 36 in advance. Simultaneously, the value of Z is detected by the high-impedance detection circuit 79. In the present embodiment, the pulse signal from the pulse generator 71 is used to determine the sampling timing.

In the present embodiment, the voltage level is adjusted by the level adjusting circuit (protecting function section) 83 of the real chip section 35 shown in FIG. 22. Even when the entire real chip section 35 including the real chip 36 is inserted into the real chip simulation section 21 (pin electronics section 33) or is removed therefrom when the simulation apparatus is in operation, the real chip simulation section 21 can be prevented from being adversely affected.

Figure 23:
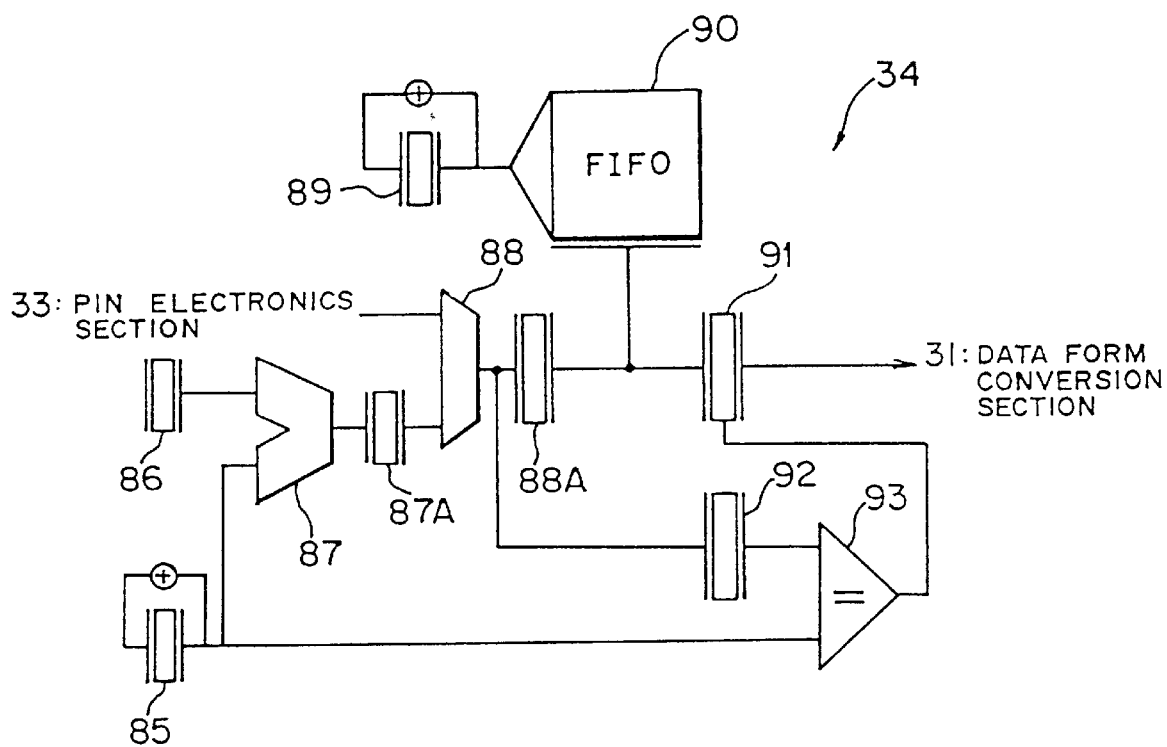
FIG. 23 is a block diagram for explaining an example of the structure and function of a real chip drive/control section in the real chip simulation section of the present embodiment.

FIG. 23 is a block diagram for explaining an example of the structure and function of the real chip drive/control section 34 in the real chip simulation section 21 of the present embodiment. In the present embodiment, the real chip drive/control section 34 shown in FIG. 23 performs synchronous control for the simulation time used on the logic simulation hardware section 22 (PEs 23) and the real operation time of the real chip 36, and operation control for operating the real chip 36 by itself.

In FIG. 23, numeral 85 denotes a resister which holds the simulation time used on the logic simulation hardware section 22. This register 85 always holds the present simulation time by its counting up operation.

Numeral 86 denotes a register for holding a delay value used in the simulation model of the real chip 36 to be simulated. Numeral 87 denotes an adder which adds the delay value held in the register 86 to a time which is held in the register 85 at the beginning of a simulating operation (simulation starting time) so as to obtain an output time at which an output pin event of the real chip 36 is to be output. Numeral 87A denotes a register for holding the output time which is calculated by the adder 87 and which indicates the timing of outputting the output pin event of the real chip 36.

Numeral 88 denotes a multiplexer for selecting and outputting event data (output value) from the real chip 36 or a value (output time) held in the register 87A. Numeral 88A is a register for temporarily holding event data from the real chip 36 which are output from the multiplexer 88. Numeral 89 denotes an address counter of an FIFO buffer 90, which will be described later. Numeral 90 denotes a buffer for receiving from the register 88A event data from the real chip 36 and for temporarily storing the event data. Numeral 91 denotes a register for receiving output pin event data from the FIFO buffer 90 and for storing the output pin event data.

Numeral 92 denotes a register for receiving and holding the value of the register 87A output from the multiplexer 88, i.e., an output time event. Numeral 93 denotes a comparator for comparing the output time held in the register 92 and the present simulation time output from the register 85. When the both times become the same, the comparator 93 outputs a command to the buffer 91 to send out output pin event data.

With the above-described structure, output values of the real chip 36, which are sampled by the pin electronics section 33, are sent out from the side A, as parallel data. Output values corresponding to a predetermined number of pins (eight pins in the present embodiment) are sent out at a time as a group.

When the value of the register 92 for output time and the present simulation time (value of the register 85) coincide with each other, the output values of the real chip 36 are sent, in response to an output command from the comparator 93, to the data form conversion section 31 via the multiplexer 88 and the registers 88A and 91. The output values are then converted into serial data and sent out to the PE event interface 25.

When the simulation time does not reach the output time, output time data are written into the register 92, and output pin event data output from the pin electronics section 33 are successively written into the FIFO buffer 90 in accordance with commands from the address counter 90.

When the result of the comparison by the comparator 93 shows that the output time written into the register 92 and the simulation time coincide with each other, event data in the FIFO buffer 90 are sent out to the PE event interface 25. Since the above-described registers are provided for each minimum structural unit of the pattern memory section 32, passing of the output time can be prevented.

Due to the function of the real chip drive/control section 34, when a period of time set as a delay value has elapsed after the simulation is started upon the reception of an input event from the logic simulation hardware section 22 (PEs 23), the output values of the real chip 36 are transferred, as the result of the simulation, from the real chip simulation section 21 to the logic simulation hardware section 22 (PEs 23) via the ET network 24.

In the embodiment shown in FIG. 23, parallel data from the real chip 36 are held in the FIFO buffer 90. However, the structure of the embodiment may be modified such that an FIFO buffer is provided in the P/S conversion section 31B of the data form conversion section 31 so as to hold data, which have been converted into a serial form, in the FIFO buffer.

Figure 24:
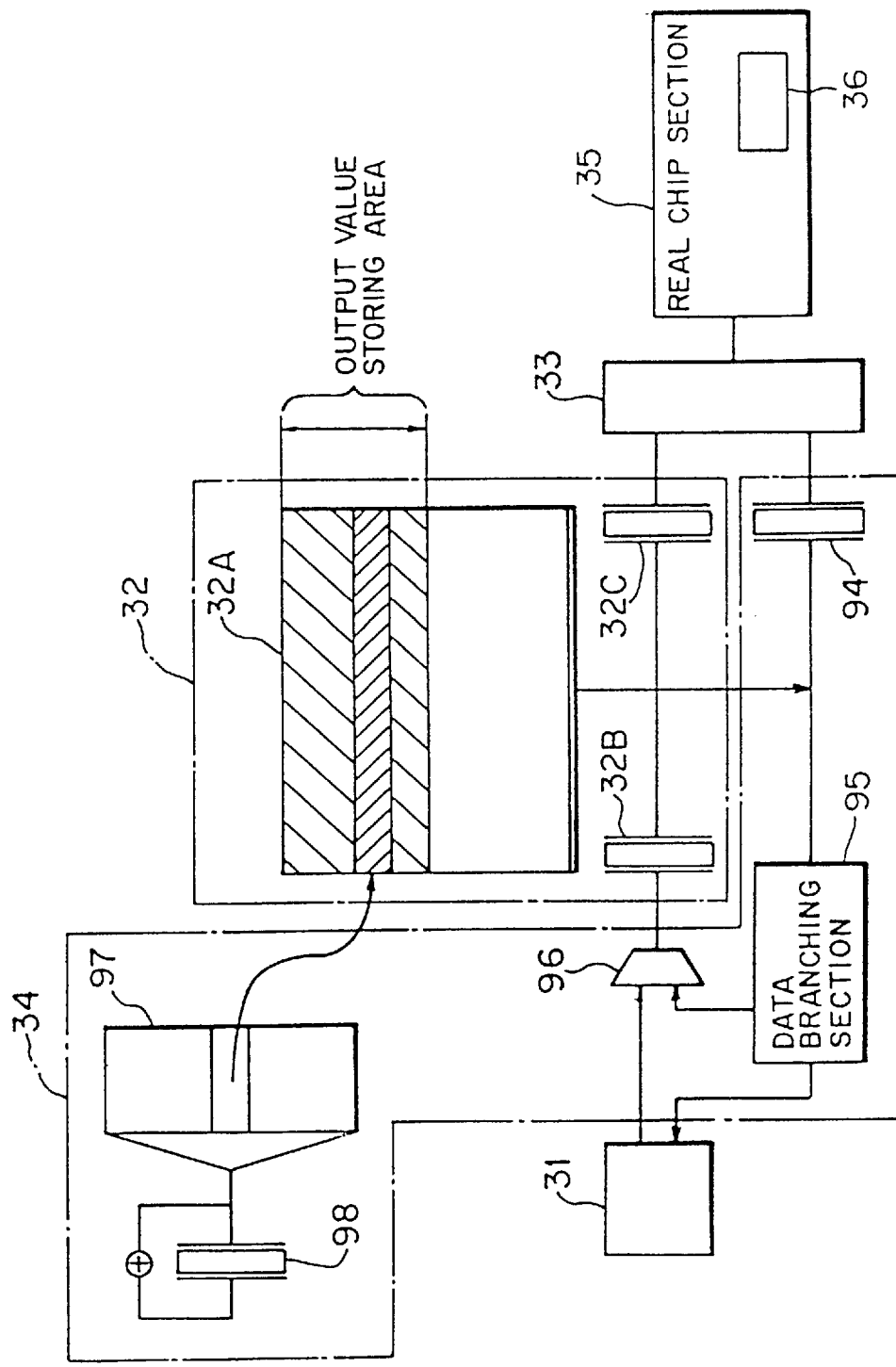
FIG. 24 is a block diagram for explaining another example of the structure and function of the real chip drive/control section in the real chip simulation section of the present embodiment.

FIG. 24 is a block diagram for explaining another example of the structure and function of the real chip drive/control section 34 in the real chip simulation section 21 of the present embodiment. In this drawing, the same symbols as those already described denote the same portions, and description therefor will be omitted.

The real chip drive/control section 34 shown in FIG. 24 comprises a register 94, a data branching section 95, a multiplexer 96, a time wheel 97, and an address counter 98.

The register 94 temporarily holds the output values of the real chip 36 which have been sampled by the pin electronics section 33. When the simulation time has not reached the output time, the data branching section 95 provides the selector 96 with output values of the real chip 36 which are held in the register 94. When the simulation time has passed the output time, output values of the real chip 36 which are held in the pattern memory 32A or the register 94 are sent out to the data form conversion section 31 (P/S conversion section 31B).

The selector 96 selects data from the data form conversion section 31 (S/P conversion section 31A) or data from the data branching section 95 and sends out the selected data to the register 32B of the pattern memory section 32.

The data from the data branching section 95 which are input to the register 32B are written into the pattern memory 32A in accordance with address information from the time wheel 97.

The time wheel 97 outputs address information when data (output values of the real chip 36) from the data branching section 95 are written into the pattern memory 32A, and when the data (output values of the real chip 36) from the data branching section 95, which are written into the pattern memory 32A, are read out therefrom. The address counter 98 outputs to the time wheel 97 addresses therefor so that the aforesaid address information is provided from the time wheel 97 to the pattern memory 32A. The time wheel 97 and the address counter 98 operate synchronously with the simulation time.

In the real chip drive/control section 34 shown in FIG. 24, the data branching section 95, the multiplexer 96, the time wheel 97 and the address counter 98 constitute a control section which arbitrarily changes the data read-out position or the data write-in position of the pattern memory section 32 for previously designated specific events among input events and output events from the real chip 36.

In the real chip drive/control section 34 shown in FIG. 24 which has the above-described structure, an area in the pattern memory 32A which starts from the end address and has a size corresponding to a predesignated delay value for the real chip 36 is used as a buffer for storing output events, and an address to which an output event is to be stored is stored on the time wheel 97 which indicates the output time.

Data on the time wheel 97 is checked synchronously with the simulation time, and when an output event exists, the output event is read out from the address of the pattern memory 32A which is designated by the time wheel 97. The output event is then sent out to the PE event interface 25 via the data branching section 95 and the data form conversion section 31.

Since the real chip drive/control section 34 has a mechanism for synchronizing the actual time and the simulation time, as shown in FIG. 23 and FIG. 24, the processing in the real chip simulation section 21 and the processing in the logic simulation hardware section 22 can be performed in parallel.

Accordingly, at a proper time during the operation of the real chip simulation section 21, the result of the simulation performed by the real chip simulation section 21 (output event of the real chip 36) is transferred to the logic simulation hardware section 22 which operates in parallel with the real chip simulation section 21. This contributes to increase the speed of simulation.

FIG. 25 and FIG. 26 are block diagrams respectively showing the detailed structures of the S/P conversion section 31A and the P/S conversion section 31B in the data form conversion section 31 of the present embodiment. In these drawings, the same symbols as those already described denote the same portions, and description therefor will be omitted.

As shown in FIG. 25, the S/P conversion section 31A of the data form conversion section 31 is formed by a decoder 101 and a plurality of registers 102. Here, the decoder 101 decodes the pin attribute included in input event data. The registers 102 are provided for the respective pins of the real chip 36 to successively hold event data which are input in a serial form.

When it is judged by the decoder 101 based on the pin attribute that the present input event is for a pin of the real chip 36 which causes a change in the internal status of the real chip 36, an enable signal enb is output from the decoder 101 to each of the registers 102 so as to successively store the input event data of a serial form in the registers 102.

In the above-described structure, a pin number and event data are serially input from the PE event interface 25, and the data are stored in one of the registers 102 which is designated by the pin number. As a result, the serial data are converted into parallel data. The pin number is accompanied by a pin location on the real chip 36 and a pin attribute. The pin attribute is sent out to the real chip drive/control section 34 which also functions as a pin attribute decoder.

As shown in FIG. 26, the P/S conversion section 31B in the data form conversion section 31 is formed by a plurality of registers 103, a pin number generator 104, and a multiplexer 105.

Each of the registers 103 holds parallel output data of the real pin 36 sampled by the pin electronics section 33. The multiplexer 105 selects data held in one of the registers 103 corresponding to the value from the pin number generator 104, and serially outputs them.

With the above-described structure, the parallel output data of the real chip 36 which have been sampled by the pin electronics section 33 are converted into serial data by the multiplexer 105, and successively output to the PE event interface 25. At this time, a pin number output from the pin number generator 104 is added to the output data from the multiplexer 105.

Figure 27:
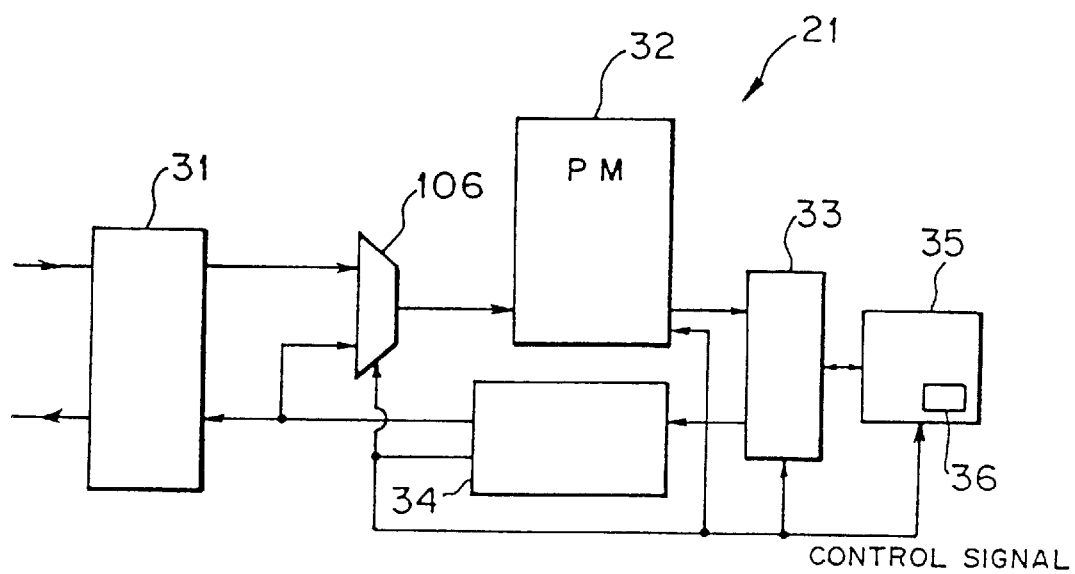
FIG. 27 is a block diagram showing an example of a structure in which the real chip simulation section of the present embodiment is used as a simulation apparatus dedicated for simulating a real chip by itself.

FIG. 27 is a block diagram showing an example of a structure in which the real chip simulation section 21 of the present embodiment is used as a simulation apparatus dedicated for simulating a real chip by itself. In this drawing, the same symbols as those already described denote the same portions, and description therefor will be omitted.

In the real chip simulation section 21 shown in FIG. 27, a multiplexer 106 is provided, in addition to the above-described data form conversion section 31, pattern memory section 32, pin electronics section 33, real chip drive/control section 34 and real chip section 35.

The multiplexer 106 performs a switching operation in response to a control signal from the real chip drive/control section 34 such that the output values of the real chip 36 which have been sampled by the pin electronics section 33 are not sent out from the real chip drive/control section 34 to the data form conversion section 31 but sent to the pattern memory section 32.

With this operation, the output events from the real chip 36 can be held in the pattern memory section 32 in a manner similar to the manner which has been described in relation to FIG. 24. That is, this pattern memory section 32 is provided with a control section which arbitrarily changes (in response to a control signal from the real chip drive/control section 34) the data read-out position or the data write-in position of the pattern memory section 32 for previously designated specific events among input events and output events from the real chip 36.

As described above, since output events can be held in the pattern memory section 32 via the multiplexer 106 and a control sequence is given to the real chip drive/control section 34 to operate the real chip simulation section 21 by itself, the real chip simulation section 21 can be operated by itself without operating the logic simulation hardware section 22 (PEs 23).

In other words, the real chip simulation section 21 of the present embodiment can operate by itself to drive the real chip 36 having an unknown internal logic, without cooperating with the logic simulation hardware section 22, and the result of the simulation can be stored in the pattern memory section 32. Accordingly, the real chip simulation section 21 can be used as a simulator dedicated for simulating real chips for themselves.

As described above, in the embodiment of the present invention, real chip simulation can be performed without hindering the functions of a hardware accelerator (logic simulation hardware section 22) which performs high speed simulation. In addition, since the portion for driving the real chip 36 is directly built into the portion where operation for the simulation is performed, the time required for the transmission and reception of events can be shortened, so that the speed of the simulation can be increased.

Also, a primitive is generated for each pin of the real chip 36 and the simulation model is closed in a simulation performing module, thereby obtaining a unified model. Accordingly, the simulation model including the real chip 36 can be simulated in the same manner as that for an ordinary software model.

In the above-described embodiment, the real chip 36 mounted on the real chip section 35 of the real chip simulation section 21 is a chip which reproduces its internal logic when being supplied with history data of input events. However, the present invention is not limited thereto, and a chip such as SRAM, PLD (Program Logic Device) and FPGA (Field Programmable Gate Array) which can reproduce its internal logic without receiving history data of input events may be mounted, as the real chip 36.

In this case, when the simulation of that real chip 36 is performed, event data from the PEs 23 are directly supplied to the real chip 36 by the pin electronics section 33. Accordingly, it becomes unnecessary to hold event data from the processor elements 23 in the pattern memory section 32 as the history data of input events. This makes the simulation of the real chip 36 easier.

What is claimed is:

1. A simulation apparatus for simulating a logic circuit, the logic circuit including a known internal logic portion and an unknown internal logic portion, said simulation apparatus comprising:

a real chip simulation section which includes a real chip said real chip simulation section driving said real chip to simulate said unknown internal logic portion;

a logic simulation hardware section which simulates said known internal logic portions; and a dedicated network which connects said real chip simulation section and said logic simulation hardware section so as to transfer event data between said real chip simulation section and said logic simulation hardware section, wherein said real chip includes input and output pins, said real chip simulation section generates a respective minimum processing unit for each of the input and output pins of said real chip, to simulate said unknown internal logic portion, and said unknown internal logic portion simulated by said real chin simulation section and said known internal logic portion simulated by said logic simulation hardware section are combined to simulate said logic circuit.

2. The simulation apparatus according to claim 1, wherein:

said logic simulation hardware section comprises a plurality of processor elements, and a communication network which performs data transmission among said processor elements and serves as said dedicated network, said known internal logic portion is divided into a plurality of partial circuits which correspond, respectively, to the plurality of processor elements, each of the processor elements simulating the corresponding partial circuit, and, to simulate the logic circuit, an arbitrary one of said plurality of processor elements is replaced with said real chip simulation section, said real simulation section being connected to said communication network.

3. The simulation apparatus according to claim 2, further comprising:

an interface between said processor elements and said communication network; and an interface between said real chip simulation section and said communication network and having the same structure as said interface between said processor elements and said communication network.

4. The simulation apparatus according to claim 3, wherein said real chip simulation section comprises:

a real chip section on which said real chip is mounted;

a data form conversion section which converts event data transferred from said processor elements through said communication network into data having a data form suitable for said real chip, and converts event data from said real chip into data having a data form suitable for said processor elements;

a pattern memory section which holds, as time-series history data of input events, event data which are transferred from said processor elements through the communication network after the initiation of simulation of said logic circuit; and a pin electronics section which
reads out, when said real chip simulates, the history data of input events from said pattern memory section so as to successively supply the history data to said real chip, thereby reproducing the internal logic of said real chip, and
samples event data from said real chip as an output event.

5. The simulation apparatus according to claim 4, wherein said data form conversion section provides two-way conversion between parallel data suitable for said real chip and serial data suitable for said processor elements.

6. The simulation apparatus according to claim 1, wherein
said real chip includes a bidirectional input/output pin having an input direction and an output direction, and
said simulation apparatus further includes a respective minimum processing unit generated for each of the input direction and the output direction of the bidirectional input/output pin.

7. The simulation apparatus according to claim 1, wherein:

the logic simulation hardware section includes a plurality of processor elements, the relationship of connection among the minimum processing units is based on element numbers which are given to said processor elements and minimum processing unit numbers which are given to the minimum processing units, and an element number corresponding to the element numbers of said processor elements is given to said real chip simulation section, and the relationship of connection between the minimum processing units is determined based on the element numbers and the minimum processing unit numbers.

8. The simulation apparatus according to claim 6, wherein:

the logic simulation hardware section includes a plurality of processor elements, the relationship of connection among the minimum processing units is determined in said logic simulation hardware section based on element numbers which are given to said processor elements and minimum processing unit numbers which are given to the minimum processing units, an element number corresponding to the element numbers of said processor elements is given to said real chip simulation section, and the relationship of connection between the minimum processing units is determined based on the element numbers and the minimum processing unit numbers.

9. The simulation apparatus according to claim 1, wherein said real chip simulation section performs simulation in parallel with said logic simulation hardware section when event data are supplied from said logic simulation hardware section to a previously designated arbitrary trigger pin of the input pins of said real chip in said real chip simulation section.

10. The simulation apparatus according to claim 6, wherein said real chip simulation section performs simulation in parallel with said logic simulation hardware section when event data are supplied from said logic simulation hardware section to a previously designated arbitrary trigger pin of the input pins of said real chip in said real chip simulation section.

11. The simulation apparatus according to claim 7, wherein said real chip simulation section performs simulation in parallel with said logic simulation hardware section when event data are supplied from said logic simulation hardware section to a previously designated arbitrary trigger pin of the input pins of said real chip in said real chip simulation section.

12. The simulation apparatus according to claim 8, wherein said real chip simulation section performs simulation in parallel with said logic simulation hardware section when event data are supplied from said logic simulation hardware section to a previously designated arbitrary trigger pin of the input pins of said real chip in said real chip simulation section.

13. The simulation apparatus according to claim 9, wherein a delay value is set in advance to determine a period of time starting when event data are supplied from said logic simulation hardware section to an arbitrary trigger pin of said input pins of said real chip and ending when an output event of said real chip which is the result of simulation by said real chip is transferred from said real chip simulation section to said logic simulation hardware section, after providing event data, said logic simulation hardware section performs simulation processing independent of the processing of said real chip simulation section for a period of time which is set as said delay value, said real chip simulation section performs simulation processing independent of the processing of said logic simulation hardware section until an output event of said real chip is determined, and when the period of time set as said delay value has elapsed, or when the output event of said real chip has been determined, the output event of said real chip is transferred, as event data, from said real chip simulation section to said logic simulation hardware section via said dedicated network.

14. The simulation apparatus according to claim 10, wherein:

a delay value is set in advance to determine a period of time starting when event data are supplied from said logic simulation hardware section to an arbitrary trigger pin of said input pins of said real chip and ending when an output event of said real chip which is the result of simulation by said real chip is transferred from said real chip simulation section to said logic simulation hardware section, after providing event data, said logic simulation hardware section performs simulation processing independent of the processing of said real chip simulation section for a period of time which is set as said delay value, said real chip simulation section performs simulation processing independent of the processing of said logic simulation hardware section until an output event of said real chip is determined, and when the period of time set as said delay value has elapsed, or when the output event of said real chip has been determined, the output event of said real chip is transferred, as event data, from said real chip simulation section to said logic simulation hardware section via said dedicated network.

15. The simulation apparatus according to claim 11, wherein:

a delay value is set in advance to determine a period of time starting when event data are supplied from said logic simulation hardware section to an arbitrary trigger pin of said input pins of said real chip and ending when an output event of said real chip which is the result of simulation by said real chip is transferred from said real chip simulation section to said logic simulation hardware section, after providing event data, said logic simulation hardware section performs simulation processing independent of the processing of said real chip simulation section for a period of time which is set as said delay value, said real chip simulation section performs simulation processing independent of the processing of said logic simulation hardware section until an output event of said real chip is determined, and when the period of time set as said delay value has elapsed, or when the output event of said real chip has been determined the output event of said real chip is transferred, as event data, from said real chip simulation section to said logic simulation hardware section via said dedicated network.

16. The simulation apparatus according to claim 12, wherein:

a delay value is set in advance to determine a period of time starting when event data are supplied from said logic simulation hardware section to an arbitrary trigger pin of said input pins of said real chip in said real chip simulation section and ending when an output event of said real chip which is the result of simulation of said real chip is transferred from said real chip simulation section to said logic simulation hardware section, after providing event data, said logic simulation hardware section performs simulation processing independent of the processing of said real chip simulation section for a period of time which is set as said delay value, said real chip simulation section performs simulation processing independent of the processing of said logic simulation hardware section until an output event of said real chip is determined, and when the period of time set as said delay value has elapsed, or when the output event of said real chip has been determined if the output event has not been determined at that time, the output event of said real chip is transferred, as event data, from said real chip simulation section to said logic simulation hardware section via said dedicated network.

17. The simulation apparatus according to claim 4, wherein a hardware device serves as said real chip and said real chip section comprises:

a connection mechanism for connecting said hardware device and said pin electronics section; and a protecting function section which allows the whole of said real chip section, including said hardware device, to be removably connected to said real chip simulation section in a state where electricity is supplied.

18. The simulation apparatus according to claim 4, wherein a device which can reproduce its internal logic without receiving history data of input events is mounted, as said real chip, on said real chip section, and, when simulation of said real chip is performed by said real chip simulation section, event data from said processor elements are directly supplied to said real chip by said pin electronics section.

19. The simulation apparatus according to claim 4, wherein said pin electronics section is provided with a signal generating section which generates data, which are the same as the data in said pattern memory section, at timing independent of the speed at which history data of input events are read out from said pattern memory section, and outputs the generated data to said real chip as an input event.

20. The simulation apparatus according to claim 4, wherein said pin electronics section is provided with a signal generating section which generates a pulse signal which has an arbitrary phase, period and pulse width which are different from those of history data of input events in said pattern memory section, and outputs the pulse signal to said real chip as an input event.

21. The simulation apparatus according to claim 4, wherein:

a portion of said pattern memory section, which holds history data corresponding to each pin of said real chip, is initialized using an initial value corresponding to each pin, and is arbitrarily divided in a history direction and in a history direction and in a pin direction, and each of the divided portions of said pattern memory section is operated independently as said pattern memory section.

22. The simulation apparatus according to claim 4, wherein said pattern memory section further comprises a control section having a control function for reading out history data of input event from said pattern memory section in a time-series order, and a control function for repeatedly reading out part of history data of input events from a continuous area of said pattern memory section, said continuous area continuing from an arbitrary starting point to an arbitrary ending point.

23. The simulation apparatus according to claim 4, wherein said real chip simulation section comprises a real chip drive/control section which transfers, as a simulation result, an output event of said real chip from said real chip simulation section to said logic simulation hardware section via said dedicated network when a period of time which is previously set as a delay value elapses after said real chip drive/control section received an input event from said logic simulation hardware section.

24. The simulation apparatus according to claim 4, wherein said pattern memory section comprises a control section which can arbitrarily change a data read-out position or a data write-in position of said pattern memory section for a previously designated specific event among input events input to said real chip simulation section and output events from said real chip.

25. The simulation apparatus according to claim 24, wherein said real chip simulation section processes information independent from processing by said logic simulation hardware section, and stores the result of simulation of said real chip into said pattern memory section.

* * * * *

UNITED STATES PATENT AND TRADEMARK OFFICE
CERTIFICATE OF CORRECTION

PATENT NO. : 5,838,593
DATED : November 17, 1998
INVENTOR(S) : Komatsu et al.

It is certified that error appears in the above-identified patent and that said Letters Patent is hereby corrected as shown below:

Title Page [75] line 4, "Kitsuregawa-machi" should be --Tochigi--.
           [56] FOREIGN PATENT DOCUMENTS, "2138605" should be --2138605A--; "2164768" should be --2164768A--.

Signed and Sealed this

Thirteenth Day of July, 1999

Attest:

Attesting Officer

Q. TODD DICKINSON

Acting Commissioner of Patents and Trademarks